(12) United States Patent
Ouye et al.

(10) Patent No.: US 9,478,455 B1
(45) Date of Patent: Oct. 25, 2016

(54) THERMAL PYROLYTIC GRAPHITE SHADOW RING ASSEMBLY FOR HEAT DISSIPATION IN PLASMA CHAMBER

(71) Applicants: Alan Hiroshi Ouye, San Mateo, CA (US); Alexander N. Lerner, San Jose, CA (US)

(72) Inventors: Alan Hiroshi Ouye, San Mateo, CA (US); Alexander N. Lerner, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/738,470

(22) Filed: Jun. 12, 2015

(51) Int. Cl.
| | |
|---|---|
| *H01L 21/683* | (2006.01) |
| *H01L 21/3065* | (2006.01) |
| *H01J 37/32* | (2006.01) |
| *H01L 21/78* | (2006.01) |
| *H01L 21/67* | (2006.01) |

(52) U.S. Cl.
CPC ..... *H01L 21/6836* (2013.01); *H01J 37/32009* (2013.01); *H01J 37/32642* (2013.01); *H01L 21/3065* (2013.01); *H01L 21/67098* (2013.01); *H01L 21/78* (2013.01)

(58) Field of Classification Search
CPC .................... H01L 21/77098; H01L 21/3065; H01L 21/78; H01L 21/6836
See application file for complete search history.

(56) References Cited

U.S. PATENT DOCUMENTS

| | | |
|---|---|---|
| 4,049,944 A | 9/1977 | Garvin et al. |
| 4,339,528 A | 7/1982 | Goldman |
| 4,684,437 A | 8/1987 | Donelon et al. |
| 5,336,638 A | 8/1994 | Suzuki et al. |
| 5,593,606 A | 1/1997 | Owen et al. |
| 5,691,794 A | 11/1997 | Hoshi et al. |
| 6,051,503 A | 4/2000 | Bhardwaj et al. |
| 6,057,180 A | 5/2000 | Sun et al. |
| 6,174,271 B1 | 1/2001 | Kosmowski |
| 6,300,593 B1 | 10/2001 | Poweli |
| 6,306,731 B1 | 10/2001 | Igarashi et al. |
| 6,407,363 B2 | 6/2002 | Dunsky et al. |
| 6,426,275 B1 | 7/2002 | Arisa |

(Continued)

FOREIGN PATENT DOCUMENTS

| | | |
|---|---|---|
| JP | 9216085 | 8/1997 |
| JP | 10321908 | 12/1998 |

(Continued)

OTHER PUBLICATIONS

Linder, V. et al., "Water-Soluble Sacrificial Layers for Surface Micromachining," www.small-journal.com, 2005, 1, No. 7, 7 pgs.

(Continued)

*Primary Examiner* — Alonzo Chambliss
(74) *Attorney, Agent, or Firm* — Blakely Sokoloff Taylor Zafman LLP

(57) ABSTRACT

Methods of and apparatuses for dicing semiconductor wafers, each wafer having a plurality of integrated circuits, are described. In an example, a shadow ring assembly for a plasma processing chamber includes an annular body including a thermally conductive material. The annular body includes a top surface to face an interior of the plasma chamber, and a bottom surface to face a substrate carrier in the plasma chamber. A plurality of posts are attached to the annular body and positioned substantially below the bottom surface of the annular body. Each of the plurality of posts includes an inner core of thermal pyrolytic graphite (TPG). The shadow ring assembly also includes a plasma resistant coating on the annular body and the plurality of posts.

19 Claims, 16 Drawing Sheets

(56) References Cited

U.S. PATENT DOCUMENTS

| | | |
|---|---|---|
| 6,465,158 B1 | 10/2002 | Sekiya |
| 6,528,864 B1 | 3/2003 | Arai |
| 6,574,250 B2 | 6/2003 | Sun et al. |
| 6,582,983 B1 | 6/2003 | Runyon et al. |
| 6,593,542 B2 | 7/2003 | Baird et al. |
| 6,642,127 B2 | 11/2003 | Kumar et al. |
| 6,676,878 B2 | 1/2004 | O'Brien et al. |
| 6,696,669 B2 | 2/2004 | Hembree et al. |
| 6,706,998 B2 | 3/2004 | Cutler |
| 6,759,275 B1 | 7/2004 | Lee et al. |
| 6,803,247 B2 | 10/2004 | Sekiya |
| 6,887,804 B2 | 5/2005 | Sun et al. |
| 6,998,571 B2 | 2/2006 | Sekiya et al. |
| 7,128,806 B2 | 10/2006 | Nguyen et al. |
| 7,129,150 B2 | 10/2006 | Kawai |
| 7,179,723 B2 | 2/2007 | Genda et al. |
| 7,265,033 B2 | 9/2007 | Shigematsu et al. |
| 7,361,990 B2 | 4/2008 | Lu et al. |
| 7,364,986 B2 | 4/2008 | Nagai et al. |
| 7,435,607 B2 | 10/2008 | Nagai |
| 7,459,377 B2 | 12/2008 | Ueda et al. |
| 7,468,309 B2 | 12/2008 | Shigematsu et al. |
| 7,473,866 B2 | 1/2009 | Morishige et al. |
| 7,507,638 B2 | 3/2009 | Mancini et al. |
| 7,507,639 B2 | 3/2009 | Nakamura |
| 7,629,228 B2 | 12/2009 | Haji et al. |
| 7,678,670 B2 | 3/2010 | Arita et al. |
| 7,687,740 B2 | 3/2010 | Bruland et al. |
| 7,754,584 B2 | 7/2010 | Kumakawa |
| 7,767,551 B2 | 8/2010 | Arita et al. |
| 7,767,554 B2 | 8/2010 | Arita et al. |
| 7,776,720 B2 | 8/2010 | Boyle et al. |
| 7,804,043 B2 | 9/2010 | Deshi |
| 7,838,323 B2 | 11/2010 | Utsumi et al. |
| 7,859,084 B2 | 12/2010 | Utsumi et al. |
| 7,875,898 B2 | 1/2011 | Maeda |
| 7,906,410 B2 | 3/2011 | Arita et al. |
| 7,923,351 B2 | 4/2011 | Arita |
| 7,926,410 B2 | 4/2011 | Bair |
| 7,927,973 B2 | 4/2011 | Haji et al. |
| 9,165,812 B2 * | 10/2015 | Ouye ................. H01L 21/683 |
| 9,209,049 B2 * | 12/2015 | Sorabji ................. C30B 31/14 |
| 9,236,284 B2 * | 1/2016 | Ouye ................. H01L 21/683 |
| 9,293,304 B2 * | 3/2016 | Ouye ................. H01J 37/32642 |
| 2003/0162313 A1 | 8/2003 | Kim et al. |
| 2004/0080045 A1 | 4/2004 | Kimura et al. |
| 2004/0137700 A1 | 7/2004 | Sekiya |
| 2004/0157457 A1 | 8/2004 | Xu et al. |
| 2004/0212047 A1 | 10/2004 | Joshi et al. |
| 2006/0043535 A1 | 3/2006 | Hiatt |
| 2006/0086898 A1 | 4/2006 | Cheng et al. |
| 2006/0088984 A1 | 4/2006 | Li et al. |
| 2006/0146910 A1 | 7/2006 | Koochesfahani et al. |
| 2006/0205182 A1 | 9/2006 | Soejima |
| 2009/0255911 A1 | 10/2009 | Krishnaswami et al. |
| 2010/0013036 A1 | 1/2010 | Carey |
| 2010/0216313 A1 | 8/2010 | Iwai |
| 2010/0248451 A1 | 9/2010 | Pirogovsky et al. |
| 2011/0014777 A1 | 1/2011 | Haji et al. |
| 2011/0312157 A1 | 12/2011 | Lei et al. |
| 2013/0045554 A1 | 2/2013 | Yamazaki |
| 2013/0065378 A1 | 3/2013 | Johnson et al. |
| 2013/0230972 A1 | 9/2013 | Johnson et al. |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| WO | WO-03036712 | 5/2003 |
| WO | WO-03071591 | 5/2003 |

OTHER PUBLICATIONS

Singh, Saravjeet et al., "Apparatus and Methods for Dry Etch With Edge, Side and Back Protection," U.S. Appl. No. 61/491,693, filed May 31, 2011 24 pgs.

Ouye, Alan Hiroshi et al., "Actively-Cooled Shadow Ring for Heat Dissipation in Plasma Chamber," U.S. Appl. No. 14/109,808, filed Dec. 17, 2013 66 pgs.

* cited by examiner

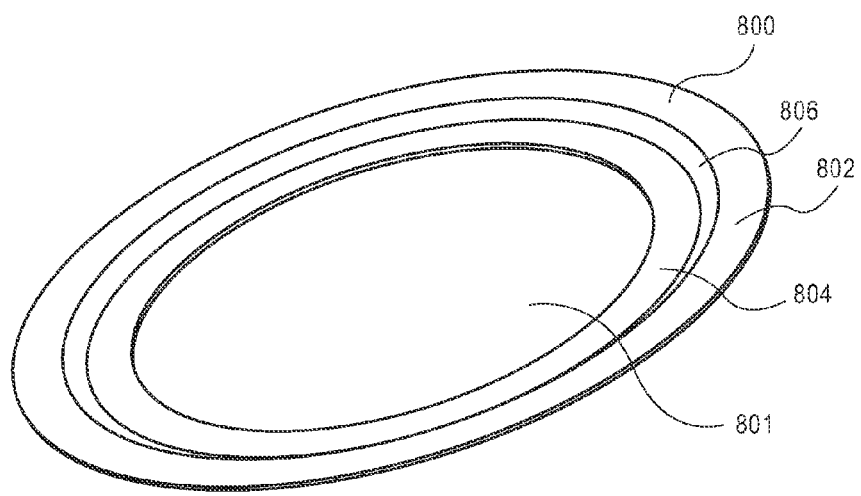
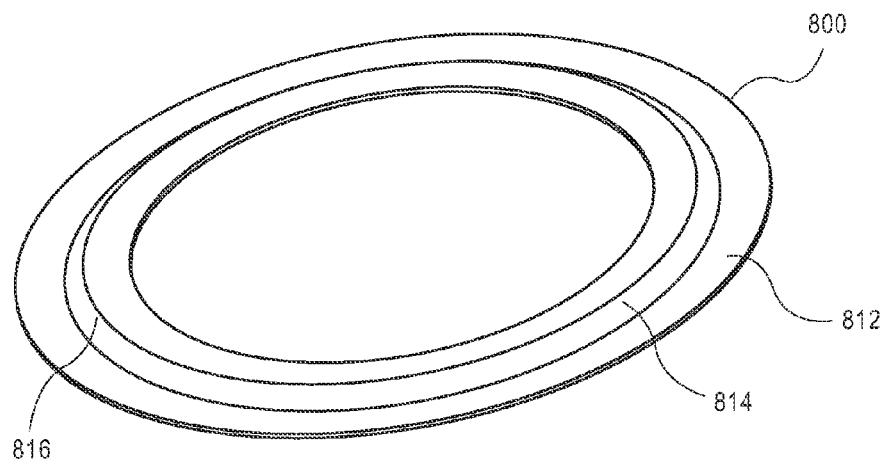
FIG. 8

THERMAL PYROLYTIC GRAPHITE SHADOW RING ASSEMBLY FOR HEAT DISSIPATION IN PLASMA CHAMBER

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dies.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dies. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dies. In addition, cracks can form and propagate from the edges of the dies into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is typically required between the dies on the wafer to prevent damage to the integrated circuits, e.g., the chips and cracks are maintained at a distance from the actual integrated circuits. As a result of the spacing requirements, not as many dies can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dies. Furthermore, after cutting, each die typically requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present invention include methods of dicing semiconductor wafers, each wafer having a plurality of integrated circuits thereon.

In an embodiment, a shadow ring assembly for a plasma chamber includes an annular body comprising a thermally conductive material. The annular body has a top surface to face an interior of the plasma chamber, and a bottom surface to face a substrate carrier in the plasma chamber. The shadow ring assembly also includes a plurality of posts attached to the annular body and positioned substantially below the bottom surface of the annular body. Each of the plurality of posts includes an inner core of thermal pyrolytic graphite (TPG). The shadow ring assembly also includes a plasma resistant coating on the annular body and the plurality of posts.

In another embodiment, a shadow ring assembly for a plasma processing chamber includes a shadow ring having an annular body and an inner opening. The inner opening is sized to expose, from a top-down perspective, at least a portion of a substrate to a plasma source of the plasma processing chamber. The shadow ring assembly also includes a plurality of solid state cooling posts attached to the annular body and positioned substantially below the annular body. Each of the plurality of solid state cooling posts includes a thermally conductive inner core and a thermally conductive outer layer. The thermally conductive core has a thermal conductivity at least three times greater than the thermally conductive outer layer.

In another embodiment, a method of dicing a semiconductor wafer including a plurality of integrated circuits involves introducing a substrate supported by a substrate carrier into a plasma etch chamber. The substrate has a patterned mask thereon covering integrated circuits and exposing streets of the substrate. The method also involves clamping the substrate carrier below a shadow ring. The shadow ring includes an annular body, and a plurality of posts attached to the annular body and positioned substantially below the bottom surface of the annular body. Each of the plurality of posts includes an inner core of TPG. The method further involves plasma etching the substrate through the streets to singulate the integrated circuits. The shadow ring shields the substrate carrier from the plasma etching, and is cooled via heat conduction through the inner core of TPG during the plasma etching.

BRIEF DESCRIPTION OF THE DRAWINGS

FIG. 8 illustrates an angled top view and angled bottom view of a plasma thermal shield, in accordance with an embodiment of the present invention.

DETAILED DESCRIPTION

Figure 1:
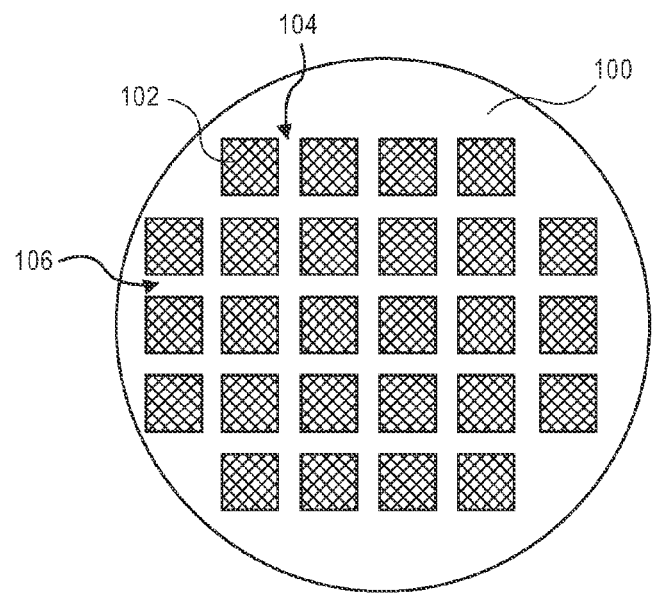
FIG. 1 illustrates a top plan of a semiconductor wafer to be diced, in accordance with an embodiment of the present invention.

Methods of and apparatuses for dicing semiconductor wafers, each wafer having a plurality of integrated circuits thereon, are described. In the following description, numerous specific details are set forth, such as substrate carriers for thin wafers, scribing and plasma etching conditions and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to a thermal pyrolytic graphite (TPG) shadow ring for heat dissipation in a plasma etch chamber. Embodiments may include plasmas and plasma based processes, thermal management, active cooling, and heat dissipation. One or more embodiments described herein are directed to a plasma thermal shield for heat dissipation in a plasma chamber. Embodiments may include plasmas and plasma based processes, thermal management, shielding of plasma generated species, and heat dissipation. Applications for either of the TPG shadow ring or the plasma thermal shield, or both, may include die singulation, but other high power etch processes or differentiated etch chemistries may benefit from embodiments described herein. The plasma thermal shield may be used on its own as an inexpensive, passive component, or it may be combined with TPG shadow ring as a thermal shield to modify plasma conditions. In the latter case, the plasma thermal shield is effectively used as a dopant source in a plasma etch process.

In another aspect, a hybrid wafer or substrate dicing process involving an initial laser scribe and subsequent plasma etch may be implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing. In one embodiment, TPG shadow ring or a plasma thermal shield, or both, are implemented during the etch portion of the dicing process. In an embodiment, the wafer or substrate is supported by a substrate carrier during the singulation process, including during the etch portion of the singulation process.

In accordance with an embodiment of the present invention, described herein are one or more apparatuses for, and methods of, protecting a substrate carrier composed of thin wafer tape and a tape frame during plasma etch in a singulation process. For example, an apparatus may be used to support and protect the film and film frame used to hold a thin silicon wafer from etch gases. The manufacturing processes related to integrated circuit (IC) packaging may require that a thinned silicon wafer be supported and mounted on a film such as a die attach film. In one embodiment, a die attach film is also supported by a substrate carrier and is used to adhere a thin silicon wafer to the substrate carrier.

To provide context, conventional wafer dicing approaches include diamond saw cutting based on a purely mechanical separation, initial laser scribing and subsequent diamond saw dicing, or nanosecond or picosecond laser dicing. For thin wafer or substrate singulation, such as 50 microns thick bulk silicon singulation, the conventional approaches have yielded only poor process quality. Some of the challenges that may be faced when singulating die from thin wafers or substrates may include microcrack formation or delamination between different layers, chipping of inorganic dielectric layers, retention of strict kerf width control, or precise ablation depth control. Embodiments of the present invention include a hybrid laser scribing and plasma etching die singulation approach that may be useful for overcoming one or more of the above challenges.

In accordance with an embodiment of the present invention, a combination of laser scribing and plasma etching is used to dice a semiconductor wafer into individualized or singulated integrated circuits. In one embodiment, femtosecond-based laser scribing is used as an essentially, if not totally, non-thermal process. For example, the femtosecond-based laser scribing may be localized with no or negligible heat damage zone. In an embodiment, approaches herein are used to singulated integrated circuits having ultra-low k films. With convention dicing, saws may need to be slowed down to accommodate such low k films. Furthermore, semiconductor wafers are now often thinned prior to dicing. As such, in an embodiment, a combination of mask patterning and partial wafer scribing with a femtosecond-based laser, followed by a plasma etch process, is now practical. In one embodiment, direct writing with laser can eliminate need for a lithography patterning operation of a photo-resist layer and can be implemented with very little cost. In one embodiment, through-via type silicon etching is used to complete the dicing process in a plasma etching environment.

Figure 2:
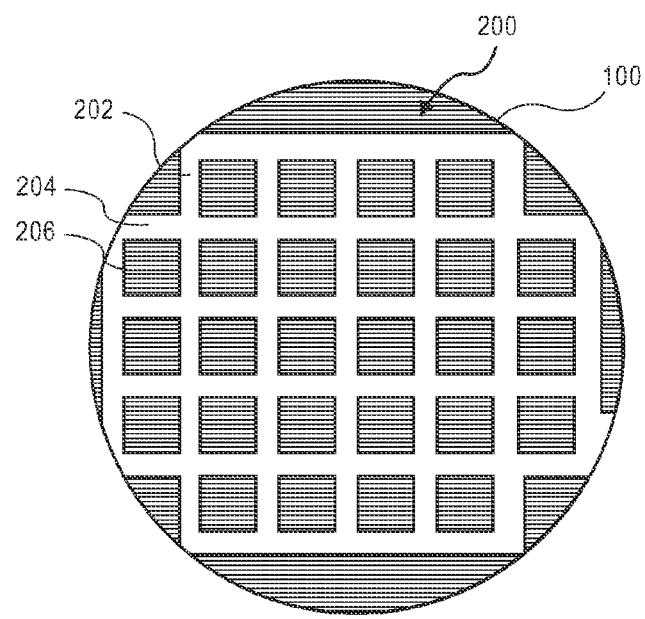
FIG. 2 illustrates a top plan of a semiconductor wafer to be diced that has a dicing mask formed thereon, in accordance with an embodiment of the present invention.

Thus, in an aspect of the present invention, a combination of laser scribing and plasma etching may be used to dice a semiconductor wafer into singulated integrated circuits. FIG. 1 illustrates a top plan of a semiconductor wafer to be diced, in accordance with an embodiment of the present invention. FIG. 2 illustrates a top plan of a semiconductor wafer to be diced that has a dicing mask formed thereon, in accordance with an embodiment of the present invention.

Referring to FIG. 1, a semiconductor wafer 100 has a plurality of regions 102 that include integrated circuits. The regions 102 are separated by vertical streets 104 and horizontal streets 106. The streets 104 and 106 are areas of semiconductor wafer that do not contain integrated circuits and are designed as locations along which the wafer will be diced. Some embodiments of the present invention involve the use of a combination laser scribe and plasma etch technique to cut trenches through the semiconductor wafer along the streets such that the dies are separated into individual chips or die. Since both a laser scribe and a plasma etch process are crystal structure orientation independent, the crystal structure of the semiconductor wafer to be diced may be immaterial to achieving a vertical trench through the wafer.

Referring to FIG. 2, the semiconductor wafer 100 has a mask 200 deposited upon the semiconductor wafer 100. In one embodiment, the mask is deposited in a conventional manner to achieve an approximately 4-10 micron thick layer. The mask 200 and a portion of the semiconductor wafer 100 are, in one embodiment, patterned with a laser scribing process to define the locations (e.g., gaps 202 and 204) along the streets 104 and 106 where the semiconductor wafer 100 will be diced. The integrated circuit regions of the semiconductor wafer 100 are covered and protected by the mask 200. The regions 206 of the mask 200 are positioned such that during a subsequent etching process, the integrated circuits are not degraded by the etch process. Horizontal gaps 204 and vertical gaps 202 are formed between the regions 206 to define the areas that will be etched during the etching process to finally dice the semiconductor wafer 100. In accordance with an embodiment of the present invention, a TPG shadow ring or a plasma thermal shield, or both, are implemented during the etch portion of the dicing process.

As mentioned briefly above, a substrate for dicing is supported by a substrate carrier during the plasma etching portion of a die singulation process, e.g., of a hybrid laser ablation and plasma etching singulation scheme. For example, FIG. 3 illustrates a plan view of a substrate carrier suitable for supporting a wafer during a singulation process, in accordance with an embodiment of the present invention.

Figure 3:
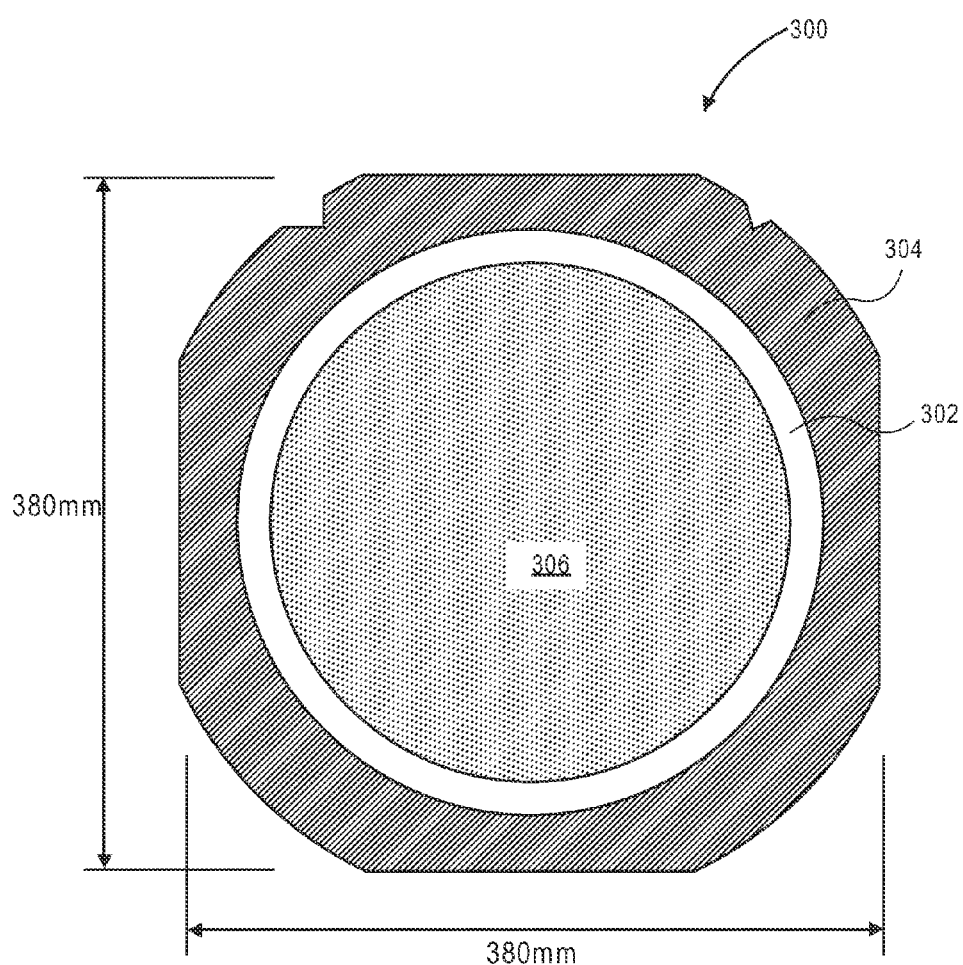
FIG. 3 illustrates a plan view of a substrate carrier suitable for supporting a wafer during a singulation process, in accordance with an embodiment of the present invention.

Referring to FIG. 3, a substrate carrier 300 includes a layer of backing tape 302 surrounded by a tape ring or frame 304. A wafer or substrate 306 is supported by the backing tape 302 of the substrate carrier 300. In one embodiment, the wafer or substrate 306 is attached to the backing tape 302 by a die attach film. In one embodiment, the tape ring 304 is composed of stainless steel.

In an embodiment, a singulation process can be accommodated in a system sized to receive a substrate carrier such as the substrate carrier 300. In one such embodiment, a system such as system 1600, described in greater detail below, can accommodate a wafer frame without impact on the system footprint that is otherwise sized to accommodate a substrate or wafer not supported by a substrate carrier. In one embodiment, such a processing system is sized to accommodate 300 millimeter-in-diameter wafers or substrates. The same system can accommodate a wafer carrier approximately 380 millimeters in width by 380 millimeters in length, as depicted in FIG. 3. However, it is to be appreciated that systems may be designed to handle 450 millimeter wafers or substrate or, more particularly, 450 millimeter wafer or substrate carriers.

In an aspect of the present invention, a substrate carrier is accommodated in an etch chamber during a singulation process. In an embodiment, the assembly including a wafer or substrate on the substrate carrier is subjected to a plasma etch reactor without affecting (e.g., etching) the film frame (e.g., tape ring 304) and the film (e.g., backing tape 302). In one such embodiment, a TPG shadow ring or a plasma thermal shield, or both, are implemented during the etch portion of the dicing process. In an example, FIG. 4 illustrates the substrate carrier of FIG. 3 with an overlying TPG shadow ring or a plasma thermal shield, or both, in accordance with an embodiment of the present invention.

Figure 4:
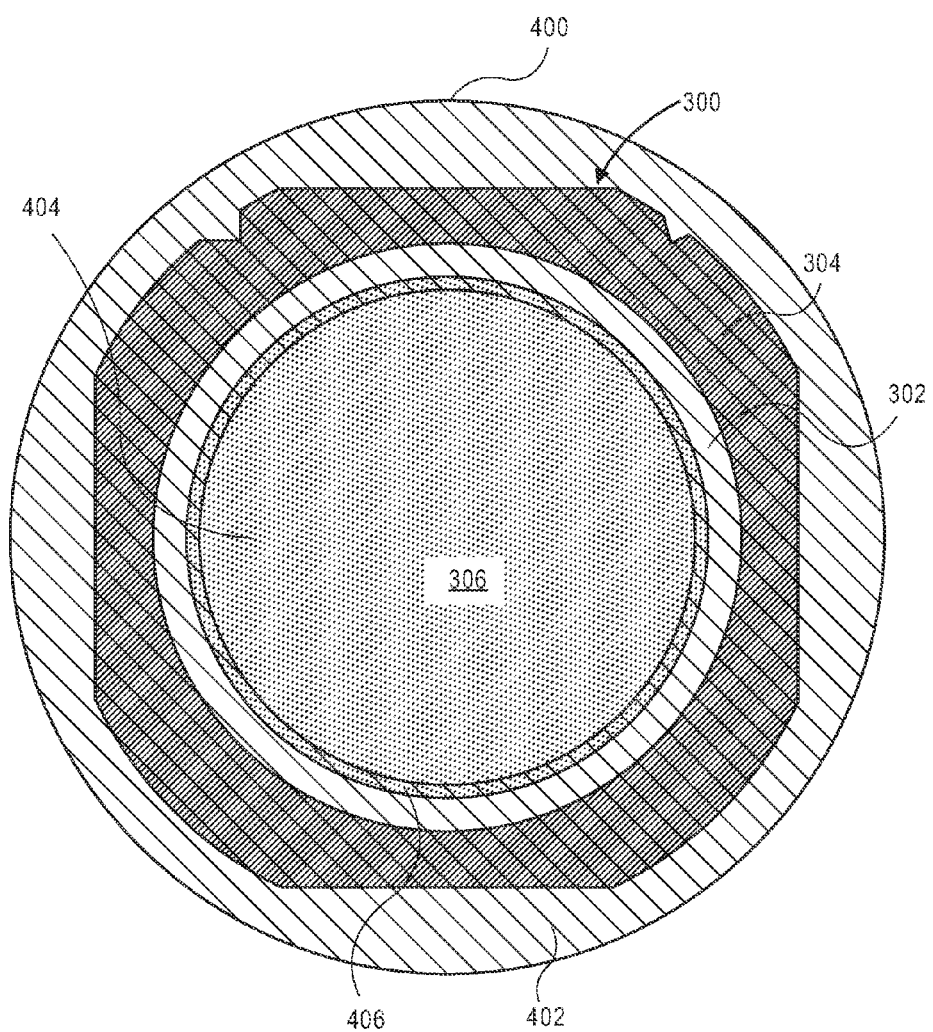
FIG. 4 illustrates the substrate carrier of FIG. 3 with an overlying TPG shadow ring or a plasma thermal shield, or both, in accordance with an embodiment of the present invention.

Referring to FIG. 4, the substrate carrier 300, including the layer of backing tape 302 and tape ring or frame 304 is covered, in a top view perspective, by a TPG shadow ring or a plasma thermal shield, or both, (all options represented as 400 in FIG. 4). The TPG shadow ring or a plasma thermal shield, or both, 400 includes a ring portion 402 and inner opening 404. In one embodiment, a portion of the supported wafer or substrate 306 is also covered by the TPG shadow ring or a plasma thermal shield, or both, 400 (specifically, portion 406 of the TPG shadow ring or a plasma thermal shield, or both, 400 covers a portion of the wafer or substrate 306). In a specific such embodiment, the portion 406 of the TPG shadow ring or a plasma thermal shield, or both, 400 covers approximately 1-1.5 mm of the outer most portion of the wafer or substrate 306. The portion covered may be referred to as the exclusion region of the wafer or substrate 306 since this area is effectively shielded from a plasma process.

In a first aspect, a TPG shadow ring for heat dissipation in a plasma chamber is now described in greater detail. In an embodiment, a TPG shadow ring can be implemented to reduce a temperature of a process kit shadow ring during processing of a wafer supported by a wafer carrier. By reducing the temperature of a shadow ring, damage or burning of a die singulation tape that otherwise occurs at elevated temperatures may be mitigated. For example, a damaged or burned die singulation tape normally leads to the wafer or substrate as not being recoverable. Furthermore, the attached tape can become damaged when the tape frame reaches an elevated temperature. Although described herein in the context of tape and frame protection during etch processing for die singulation, use of a TPG shadow ring can provide other process benefits can include an increase in throughput. For example, temperature reduction may otherwise be achieved by easing of process conditions such as RF power reduction, but this may require an increase in process time which is detrimental to throughput.

Figure 5A:
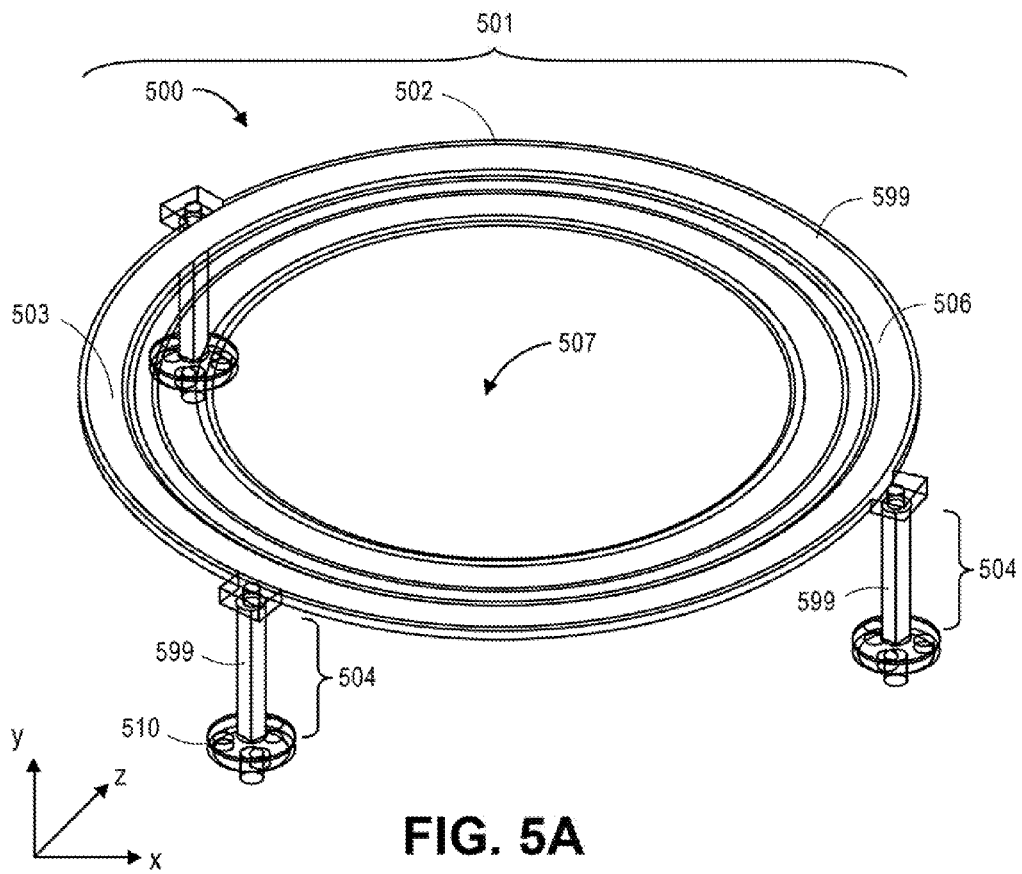
FIG. 5A illustrates an angled view of a TPG shadow ring assembly for heat dissipation in a plasma chamber, in accordance with an embodiment of the present invention.

FIG. 5A illustrates an angled view of a TPG shadow ring assembly 500 for heat dissipation in a plasma chamber, in accordance with an embodiment of the present invention. Referring to FIG. 5A, the TPG shadow ring assembly 500 includes a shadow ring 502. The shadow ring 502 has an annular body 501 that includes a thermally conductive material. For example, the annular body 501 of the shadow ring 502 may be formed from aluminum or another thermally conductive material. In one embodiment with an aluminum annular body, the annular body 501 may be formed from aluminum having a hard anodized surface or a ceramic coating.

The annular body 501 has a top surface 503 to face an interior of the plasma chamber, and a bottom surface 505 (shown in FIG. 5B) to face a substrate carrier in the plasma chamber. The shadow ring 502 also has an inner opening 507. According to one embodiment, the inner opening 507 in the annular body 501 is sized to expose, from a top-down perspective, a portion of, but not all of, a substrate processing region of the plasma processing chamber to a plasma source of the plasma processing chamber. The annular body 501 is sized for clamping a tape frame of the substrate carrier and for covering the tape frame and open tape region of the substrate carrier. In one such embodiment, the inner opening 507 is sized to expose all but the outermost approximately 1-1.5 millimeters of a substrate supported by the substrate carrier to the plasma source of the plasma processing chamber.

In one embodiment, the shadow ring 502 includes an annular core 506 embedded within the shadow ring 502 (e.g., encapsulated by the annular body 501). In one such embodiment, the annular core 506 has a substantially higher thermal conductivity than the annular body 501 in which the annular core 506 is embedded. For example, in one embodiment, the annular core 506 is formed from TPG and the annular body 501 is formed from aluminum. Embedding a TPG core in the shadow ring 502 can enable increased heat transfer, and thus improved cooling when compared to a shadow ring made from aluminum only. The annular core 506 is described in greater detail below with respect to FIGS. 6A, 6B, and 7. Other embodiments do not include a separate annular core 506 (e.g., the annular body 501 is formed from a single thermally conductive material, and does not include a core formed from a different thermally conductive material).

The shadow ring assembly 500 also includes a plurality of posts 504 attached to the annular body 501. As illustrated in FIG. 5A, the plurality of posts 504 are positioned substantially below the annular body 501. In one embodiment, the posts 504 are substantially cylindrical and perpendicular to the annular body 501. However, other embodiments may include posts having other shapes, such as posts having a rectangular, square, pentagonal, hexagonal, etc., cross-section. Although three posts 504 are illustrated in FIG. 5A, other numbers of posts are possible (e.g., two, four, or more posts). As illustrated in FIG. 5A, in one embodiment, each of the plurality of posts 504 is attached to a side of, and below relative to, the annular body 501. However, in other embodiments, the plurality of posts 504 may be located completely under the annular body 501.

The posts 504 are in direct physical contact with the shadow ring 502 (e.g., in direct physical contact with the annular body 501), and may be fused into a unified assembly by welding or other means. Gaps between the posts 504 and the shadow ring 502 may interfere with heat transfer from the shadow ring 502 to the posts 504. Therefore, to maximize heat dissipation, the posts 504 are physically well-connected to the shadow ring 502, according to embodiments. The annular core 506 may or may not be in close proximity to the posts 504. If the geometry allows, the inner core 508 and the annular core 506 may be in direct contact, which could increase heat transfer in accordance with embodiments. The shadow ring assembly 500 also typically includes a plasma resistant coating 599 on the surfaces of the shadow ring 502 (e.g., on the annular body 501) and on the plurality of posts 504, as is referenced in FIG. 5A.

According to embodiments, each of the plurality of posts 504 includes a thermally conductive inner core 508 and a thermally conductive outer layer 514. According to one such embodiment, the thermally conductive inner core 508 has a substantially higher thermal conductivity than the thermally conductive outer layer 514. For example, in one embodiment, the inner core 508 is formed from TPG, as is explained in more detail below with respect to FIGS. 6C and 7. Other embodiments may include posts without a TPG core.

The shadow ring assembly 500 also includes a plurality of thermally conductive plates 510. Each of the thermally conductive plates 510 is to physically couple with one of the plurality of posts 504 at an end opposite to the annular body 501. The plurality of thermally conductive plates 510 act as a heat sink for the posts 504 and shadow ring 502. Although FIG. 5A illustrates a separate conductive plate attached to each post 504, other embodiments may include different heat sink mechanisms to remove heat from the posts 504.

Thus, embodiments may include shadow ring assemblies including: a TPG core embedded in both the posts 504 and the annular body 501, a TPG core embedded in the posts 504 (without a TPG core embedded in the annular body 501), or a TPG core embedded in the annular body 501 (without a TPG core embedded in the posts 504). The TPG core(s) enable cooling of the shadow ring via solid state parts (e.g., without active cooling mechanisms such as mechanisms for circulating a chilled fluid in the shadow ring assembly). The TPG core(s) create highly thermally conductive pathways for dissipating radiant heat. For example, the shadow ring 502 absorbs the plasma-generated heat. In an embodiment with an annular core 506 embedded in the shadow ring 502, the annular core 506 absorbs the heat from the surface of the shadow ring 502 and radially transfers this heat to the posts 504 at or near the perimeter of the shadow ring 502. This heat is transferred through the posts 504 to the plates 510 below. In embodiments in which an inner core is embedded in the posts 504, the inner core transfers the heat to the plates 510 below. In one embodiment, the heat is removed from the inner diameter portion of the shadow ring 502 and migrated to the outer diameter of the shadow ring 502, which is then transferred down the posts 504 and out of the assembly through the heat sink(s).

Figure 5B:
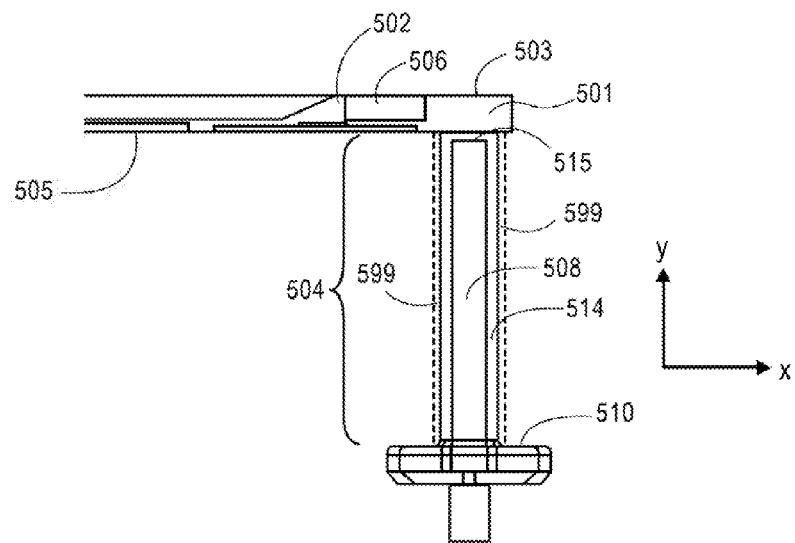
FIG. 5B illustrates a cross-sectional view of the TPG shadow ring assembly of FIG. 5A, in accordance with an embodiment of the present invention.

Thus, the TPG shadow ring assembly 500 may sufficiently cool the shadow ring 502 to prevent the damage to the die singulation tape mentioned above. Embodiments including a TPG core embedded in both the posts 504 and the annular body 501 (as illustrated in FIGS. 5A and 5B) would have a greater ability to dissipate heat than a TPG shadow ring assembly with a TPG core in only one of the shadow ring 502 and the posts 504, according to embodiments. According to embodiments, the TPG shadow ring assembly 500 can reduce the temperature of the shadow ring 502 significantly (e.g., from 400° C. to 170° C.).

FIG. 5B illustrates a cross-sectional view of the TPG shadow ring assembly of FIG. 5A, in accordance with an embodiment of the present invention. FIG. 5B illustrates an embodiment with an inner core 508 embedded in the posts 504. As illustrated in FIG. 5B, the inner core 508 is complete encapsulated by an outer layer 514. Although the layer 514 is referred to as an "outer" layer, other layers may be disposed on the layer 514. For example, the outer layer 514 may be disposed between the inner core 508 and a plasma resistant coating 599, as is depicted in FIG. 5B. The outer layer 514 may provide physical strength and stability to the posts 504, while also being thermally conductive. For example, in one embodiment, the outer layer 514 is formed from aluminum and the inner core 508 is formed from TPG. According to one embodiment, the thermally conductive inner core 508 has a thermal conductivity at least three times greater than the outer layer 514. In one such embodiment, the thermal conductivity of the inner core is 1400-1700 watts per meter K (W/(m·K)). Therefore, the inner core 508 may form a heat pipe to dissipate heat from the shadow ring 502.

As mentioned briefly above, in one embodiment, the inner core 508 is completely encapsulated by the outer layer 514. As can be seen in FIG. 5B, a thin layer is disposed between the top 515 of the inner core 508 and the shadow ring 502. The thin layer above the top 515 of the inner core 508 enables a welding contact between the posts 504 and the shadow ring 502. The bottom of the inner core 508 may also be separated from the plates 510 by the outer layer 514, which may prevent the inner core 508 from being attacked by the wet clean fluids, in accordance with an embodiment. The annular core 506 may also be completely encapsulated within the annular body 501, which would also typically be coated by a plasma resistant coating.

FIGS. 6A, 6B, 6C, and 7 illustrate additional details of the annular core 506 and the inner core 508, in accordance with embodiments.

Figure 6A:
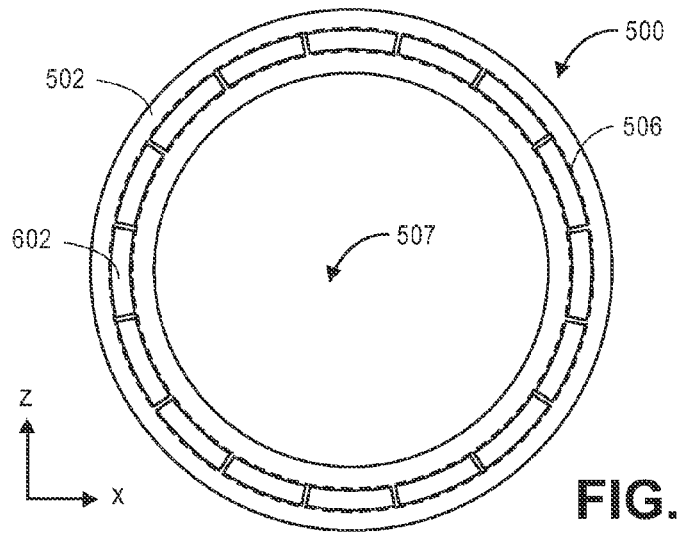
FIG. 6A illustrates a cross-sectional view of a shadow ring of a TPG shadow ring assembly, in accordance with an embodiment of the present invention.
Figure 6B:
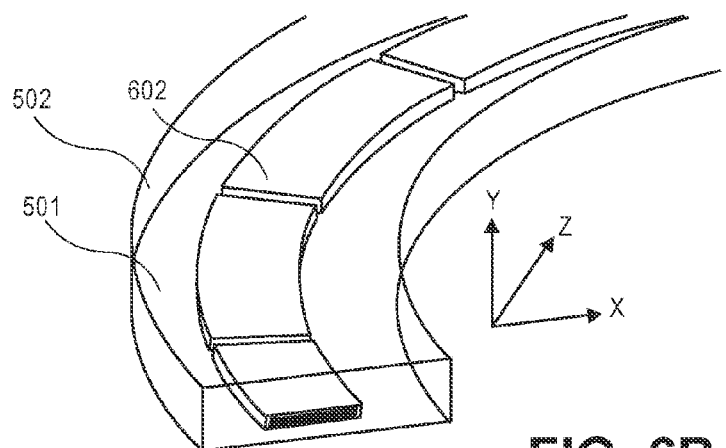
FIG. 6B illustrates another cross-sectional view of the shadow ring of FIG. 6A, in accordance with an embodiment of the present invention.
Figure 7:
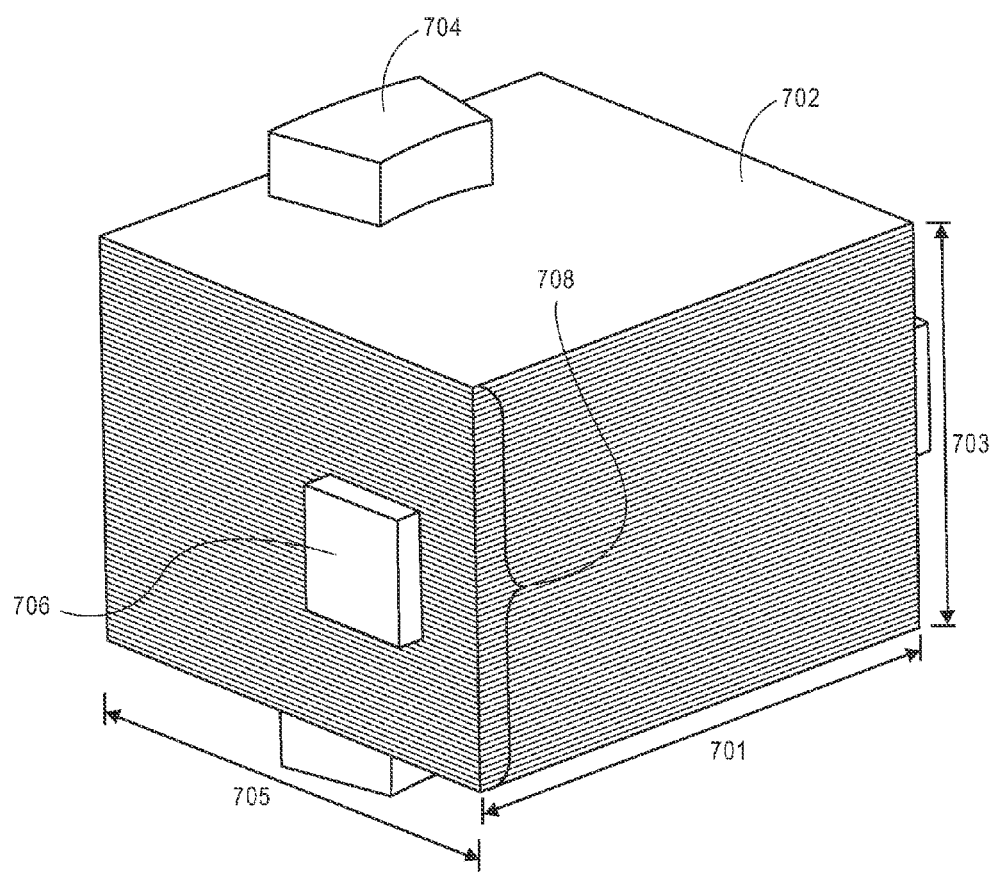
FIG. 7 illustrates a block of TPG from which an inner post core and annular ring sections may be cut, in accordance with an embodiment of the present invention.

FIG. 6A illustrates a cross-sectional view of a shadow ring (such as a cross section of the shadow ring 502 of FIG. 5A along the XZ-axis), in accordance with an embodiment of the present invention. FIG. 6B illustrates another cross-sectional view of the TPG shadow ring (such as a cross section of the shadow ring 502 of FIG. 5A along the XY-axis), in accordance with an embodiment of the present invention. As illustrated in FIG. 6A, in one embodiment, the annular core 506 is not a single piece of TPG, but includes a plurality of sections 602. The sections 602 may be approximately wedge-shaped, such as in the shape of a key stone, and are disposed side-by-side to form an approximate annular shape. The size of the sections 602 may depend on the radial size and thickness of the shadow ring 502. As can be seen in FIG. 6B, the sections 602 are formed from a layered material (e.g., layered TPG). The layers of the sections 602 are approximately parallel to the surfaces 503, 505 of the shadow ring 502. FIG. 7 and the corresponding description include additional details regarding TPG layers.

Figure 6C:
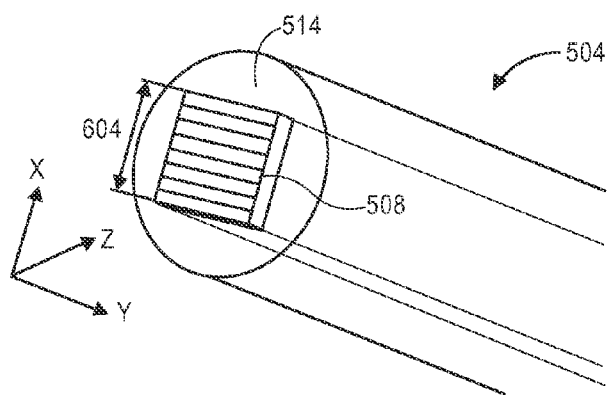
FIG. 6C illustrates a cross-sectional view of a post of a TPG shadow ring assembly, in accordance with an embodiment of the present invention.

FIG. 6C illustrates a cross-sectional view of a post of a TPG shadow ring assembly (such as a cross section of the post 504 of FIG. 5A along the XZ-axis), in accordance with an embodiment of the present invention. In the embodiment illustrated in FIG. 6C, the inner core 508 has a square cross-section. However, other embodiments could include inner cores having cross sections having different shapes, such as round, pentagonal, hexagonal, etc. In one embodiment, the diameter 604 of the inner core 508 of each of the posts 504 is in a range of 0.25-1 inch. Other embodiments could include inner cores having different diameters, depending on the desired level of heat dissipation, where larger inner cores enable greater heat dissipation. Also as illustrated in FIG. 6C, the inner core 508 includes a layered material (e.g., TPG). Each of the plurality of layers is substantially perpendicular to the shadow ring 502, and therefore also substantially perpendicular to the annular body 501 and the annular core 506.

FIG. 7 illustrates a block of TPG from which an inner post core (e.g., the inner core 508) and annular ring sections (e.g., the sections 602) may be cut, in accordance with an embodiment of the present invention. The TPG has a plurality of layers 708 of graphite, which are not covalently bonded between layers. The TPG has greater heat transfer directionality at the ends of the layers (e.g., in the directions 701 and 705) compared to the top and bottom surfaces (e.g., in the direction 703). Therefore, according to an embodiment, the TPG is an anisotropic material. TPG is typically made in rectangular blocks or plates, as illustrated by the TPG block 702 in FIG. 7. The sections 602 and inner core 508 may then be cut in the desired shapes from the block 702 (as illustrated by the sections 704 and the core 706). For example, as illustrated in FIG. 7, the sections 602 may be cut from the block 702 such that the layers are parallel to the shadow ring 502. The inner cores of the posts 504 may be cut such that the layers are perpendicular to the shadow ring 502.

Thus, FIGS. 5A, 5B, 6A-6C, and 7 illustrate examples of a TPG shadow ring assembly, in accordance with embodiments. According to embodiments, a TPG core is embedded within the shadow ring and/or posts. The TPG-containing shadow ring and posts may then be fused together to form a unified shadow ring for optimum heat transfer, in accordance with embodiments. The unified shadow ring and posts may then be coated with a plasma-resistant material and attached to one or more plates, which act as a heat sink for the assembly. The TPG shadow ring assembly may provide significant heat dissipation without relying on active cooling. Therefore, the TPG shadow ring assembly may effectively cool the shadow ring without incurring the costs of an actively-cooled shadow ring assembly. Additionally, the TPG shadow ring assembly may avoid some problems that may be encountered during plasma processing with an actively-cooled shadow ring, such as fluid leaks in the plasma chamber. Although embodiments described above may sufficiently cool the shadow ring without active cooling mechanisms, the embodiments described may be used in conjunction with active cooling mechanisms.

In a second aspect, a plasma thermal shield for heat dissipation in a plasma chamber is now described in greater detail. The plasma thermal shield can be used with a standard shadow ring as an inexpensive, passive component for thermal protection of substrate carrier that is plasma etched using a conventional shadow ring. On the other hand, the plasma thermal shield may be used together with the above described TPG shadow ring.

As an example FIG. 8 illustrates an angled top view and angled bottom view of a plasma thermal shield, in accordance with an embodiment of the present invention.

Referring to the top view of FIG. 8, a plasma thermal shield 800 is an annular ring with an inner opening 801. In an embodiment, the plasma thermal shield 800 is sized and shaped to be compatible with, e.g., by nesting upon a top surface of, a shadow ring included in a plasma processing chamber. For example, in one such embodiment, the surface of the plasma thermal shield 800 shown in the top view is the surface exposed to a plasma during processing. The surface of the top view includes a first upper surface region 802 which is raised above a second upper surface region 804. The first and second upper surfaces 802 and 804, respectively, are coupled by a sloping region 806.

Referring to the bottom view of FIG. 8, the plasma thermal shield 800 has a bottom surface that is not exposed to a plasma during processing. The surface of the bottom view includes a first lower surface region 812 which is below a second lower surface region 814. The first and second lower surfaces 812 and 814, respectively, are coupled by a sloping region 816. In general, from a high level view, in an embodiment, the bottom surface of the plasma thermal shield 800 reciprocates the general topography of the upper surface. However, as described in association with FIG. 9, some regions of the bottom surface of the plasma thermal shield 800 may be removed for heat dissipating applications.

Figure 9:
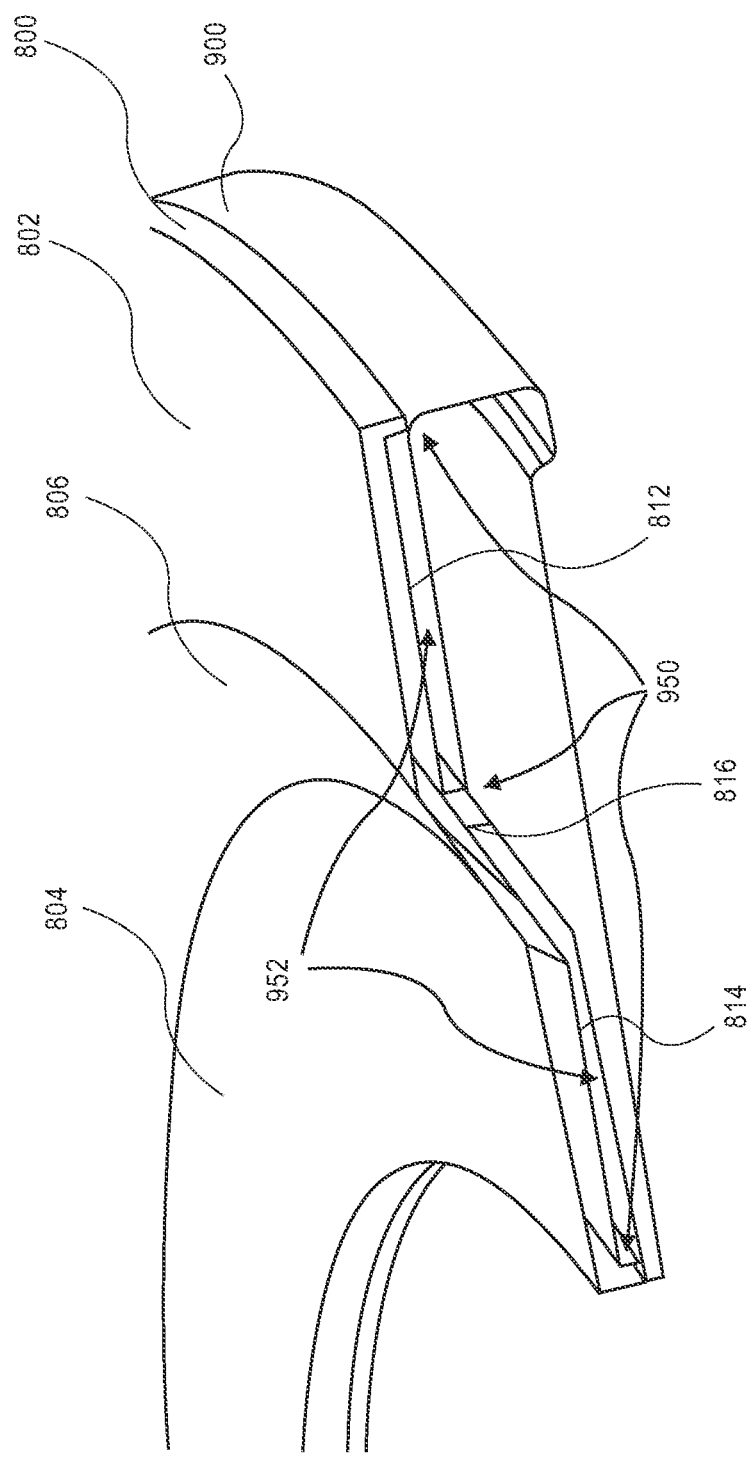
FIG. 9 illustrates an enlarged angled cross-sectional view of the plasma thermal shield of FIG. 8 as positioned on a top surface of a shadow ring, in accordance with an embodiment of the present invention.

FIG. 9 illustrates an enlarged angled cross-sectional view of the plasma thermal shield 800 of FIG. 8 as positioned on a top surface of a shadow ring 900, in accordance with an embodiment of the present invention.

Referring to FIG. 9, the plasma thermal shield 800 is nested on an upper surface of a shadow ring 900 (which, in an embodiment, is a TPG shadow ring as described in association with FIG. 5A). The upper surface portions 802, 804 and 806 are as described above with respect to FIG. 8. However, in the enlarged view of FIG. 9, it can be seen that the bottom surface portions 812, 814 and 816 of the plasma thermal shield 800 have recessed portions therein. In the particular example shown in FIG. 9, a first gap or cavity 952 is formed between regions 814 and 816 of the bottom surface, and a second gap or cavity 952 is formed between regions 812 and 816 of the bottom surface. The effect is to leave remaining three protruding portions or contact features 950 that raise a majority of the bottom surface of the plasma thermal shield 800 off of the top surface of the shadow ring 900. In an embodiment, the three protruding portions or contact features 950 run the entire annular length to provide nesting support for the plasma thermal shield 800 when nested on the upper surface of the shadow ring 900.

In an embodiment, the three protruding portions or contact features 950 raise the majority of the bottom surface of the plasma thermal shield 800 off of the top surface of the shadow ring 900 by a height of approximately $1/16^{th}$ of an inch. Thus, first and second gaps or cavities 952 have a height of approximately $1/16^{th}$ of an inch. In one such embodiment, the thinned regions of surfaces 814 and 812 have a remaining thickness of approximately $1/16^{th}$ of an inch. It is to be appreciated, however, that the size of the gaps or cavities 952 (as a height dimension) provide a trade-off between distancing heat from an underlying shadow ring versus having sufficient material in the plasma thermal shield for absorbing heat. Thus, the height of the gaps can be varied by application. Furthermore, the extent and locations of the recessed portions between protruding or contact portions 950 are subject to the same trade-off. In one embodiment, an amount of surface area of the bottom surface of the plasma thermal shield 800 that is recessed is approximately in the range of 85-92%. In an embodiment, the plasma thermal shield 800 is composed of a material such as, but not limited to, alumina ($Al_2O_3$), yttria ($Y_2O_3$), silicon nitride (SiN) or silicon carbide (SiC). In one embodiment, the plasma thermal shield 800 is composed of a process sensitive material and can act as a source of dopant for a plasma process. In an embodiment, the plasma thermal shield 800 can be viewed as an external device used to prevent contact of an underlying shadow ring with a hot surface or to act as a heat deflector for the underlying shadow ring.

In an embodiment, the plasma thermal shield 800 and the shadow ring 900 are installed as two separate components. In one embodiment, both the shadow ring 900 surface and the plasma thermal shield 800 barrier are composed of alumina, where the plasma thermal shield 800 provides heat dissipation away from the surface of the shadow ring 900 even though the materials are the same. In an embodiment, the plasma thermal shield 800 blocks heat transfer to the shadow ring 900 which is in contact with a tape frame of a substrate or wafer carrier. In an embodiment, with respect to power distribution, an open area of tape from the carrier may be positioned below the thinnest section of the shadow ring 900. The consequential lowest mass region of the shadow ring 900 is may be the highest in temperature. Accordingly, in an embodiment, the plasma thermal shield 800 is designed to have greater mass and smaller gap in this region relative to the remainder of the plasma thermal shield 800, i.e., greater proportional mass is added to the tape region of the carrier.

Thus, in an embodiment, a plasma thermal shield is cross-sectionally a shell of ceramic located on top of an existing shadow ring. In one embodiment, the material of the plasma thermal shield is the same material as the shadow ring and covers the entire top surface of the shadow ring. The top surface of the plasma thermal shield may or may not be conformal to the shadow ring below. In one embodiment, the top surface of a plasma thermal shield is a continuous surface and the underside has removed areas of material to reduce conduction to the shadow ring. In an embodiment, the contact points between a plasma thermal shield and shadow ring are related to prohibiting plasma into removed areas as well as installation alignment. It is to be appreciated that the removed area cannot be so great as to create a significant plasma in the removed areas. In the plasma environment, the heat generated by the plasma is transferred to the plasma thermal shield. The plasma thermal shield increase in temperature heats up and radiates the heat to the shadow ring below. However, the shadow ring is heated only by radiated energy from the plasma thermal shield and not by direct plasma contact.

In an embodiment, a plasma thermal shield is a single passive part. The shape and material of the plasma thermal shield can be modified for different process conditions. In an embodiment, the plasma thermal shield can be used to reduce the temperature of a shadow ring by a factor in the range of 100-120 degrees Celsius. The plasma thermal shield may also be used as a differentiated material cover for process chemistry modification, essentially providing a dopant source to the plasma process.

In an embodiment, a plasma thermal shield is used together with a TPG shadow ring. Thus, possible assemblies described herein for protecting a substrate or wafer carrier during plasma processing include a TPG shadow ring, a shadow ring having a plasma thermal shield thereon, or a TPG shadow ring having a plasma thermal shield thereon. In all three scenarios, from a plan view perspective, a protective annular ring with exposing inner region is provided for plasma processing of the carrier.

In an aspect of the present invention, an etch reactor is configured to accommodate etching of a thin wafer or substrate supported by a substrate carrier. For example, FIG. 10 illustrates a cross-sectional view of an etch reactor, in accordance with an embodiment of the present invention.

Figure 10:
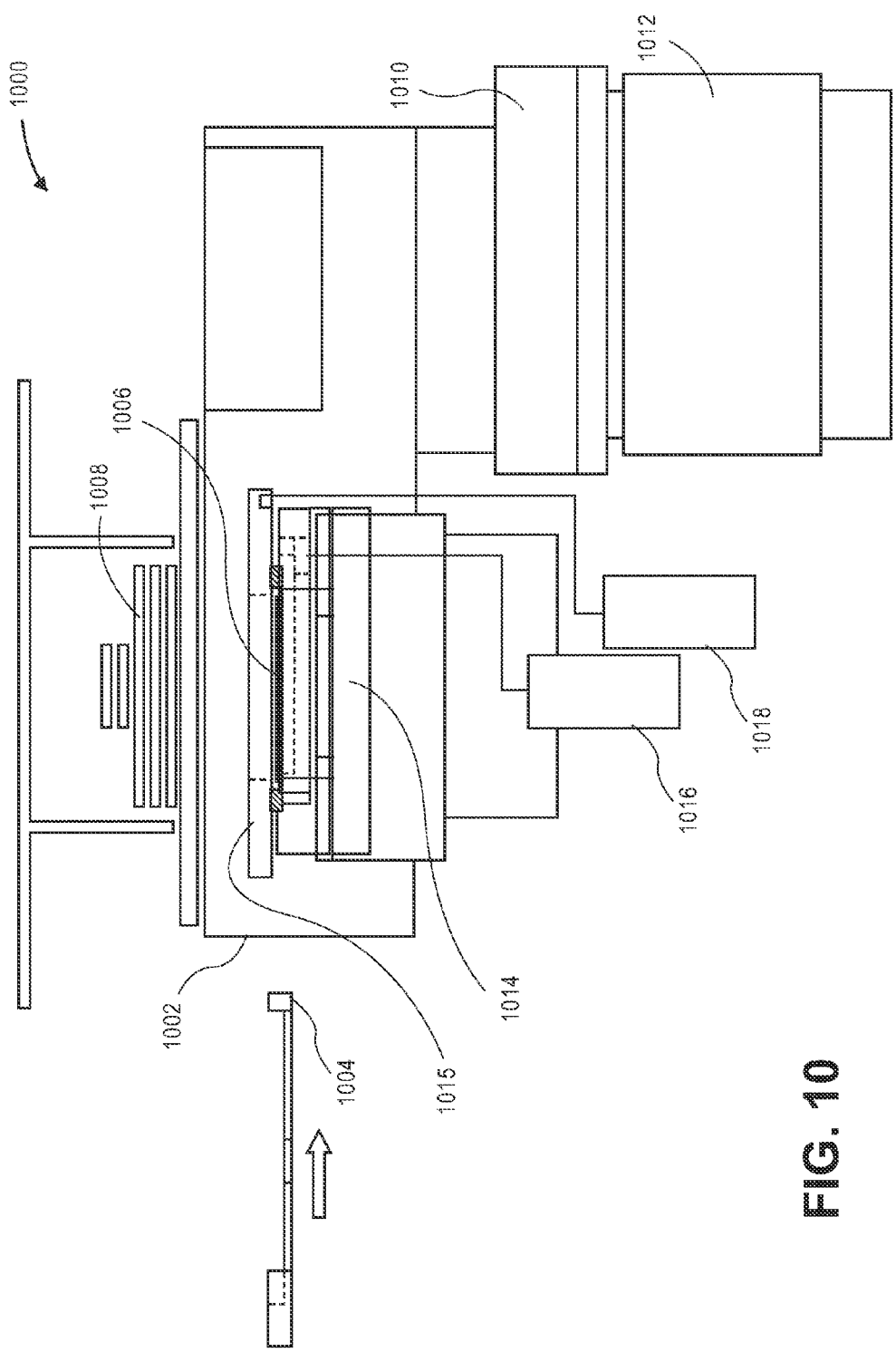
FIG. 10 illustrates a cross-sectional view of an etch reactor, in accordance with an embodiment of the present invention.

Referring to FIG. 10, an etch reactor 1000 includes a chamber 1002. An end effector 1004 is included for transferring a substrate carrier 1006 to and from chamber 1002. An inductively coupled plasma (ICP) source 1008 is positioned in an upper portion of the chamber 1002. The chamber 1002 is further equipped with a throttle valve 1010 and a turbo molecular pump 1012. The etch reactor 1000 also includes a cathode assembly 1014 (e.g., an assembly including an etch cathode or etch electrode). A shadow ring assembly 1015 is included above the region accommodating the substrate or wafer carrier 1006. In an embodiment, the shadow ring assembly 1015 is one of a TPG shadow ring, a shadow ring having a plasma thermal shield thereon, or a TPG shadow ring having a plasma thermal shield thereon. A shadow ring actuator 1018 may be included for moving the shadow ring. Other actuators, such as actuator 1016 may also be included.

In an embodiment, the end effector 1004 is a robot blade sized for handling a substrate carrier. In one such embodiment, the robotic end effector 1004 supports a film frame assembly (e.g., substrate carrier 300) during transfer to and from an etch reactor under sub-atmospheric pressure (vacuum). The end effector 1004 includes features to support the substrate carrier in the X-Y-Z axis with gravity-assist. The end effector 1004 also includes a feature to calibrate and center the end effector with respect to circular features of a processing tool (e.g., an etch cathode center, or a center of a circular silicon wafer).

In one embodiment, an etch electrode of the cathode assembly 1014 is configured to allow RF and thermal coupling with the substrate carrier to enable plasma etching. However, in an embodiment, the etch electrode only contacts a backing tape portion of a substrate carrier and not the frame of the substrate carrier.

In an embodiment, the shadow ring 1015 includes a protective annular ring, a lift hoop, and three supporting posts coupled between the lift hoop and the protective annular ring. The lift hoop may function as a heat sink, similar to the thermally conductive plates 510 described above with reference to FIG. 5A. The lift hoop is disposed in a processing volume radially outwards of a supporting assembly. The lift hoop is mounted on a shaft in a substantially horizontal orientation. The shaft is driven by an actuator to move the lift hoop vertically in the processing volume. The three supporting posts extend upward from the lift hoop and position the protective annular ring above the supporting assembly. The three supporting posts may fixedly attach the protective annular ring to the lift hoop. The protective annular ring moves vertically with the lift hoop in the processing volume so that the protective annular ring can be positioned at a desired distance above a substrate and/or an exterior substrate handling device (such as a substrate carrier) can enter the processing volume between the protective annular ring and the supporting assembly to transfer the substrate. The three supporting posts may be positioned to allow the substrate carrier to be transferred in and out of a processing chamber between the supporting posts. Thus, the lift loop may function as part of the lift system, as well as function as both a heat sink for heat dissipation from the posts and shadow ring.

Figure 11:
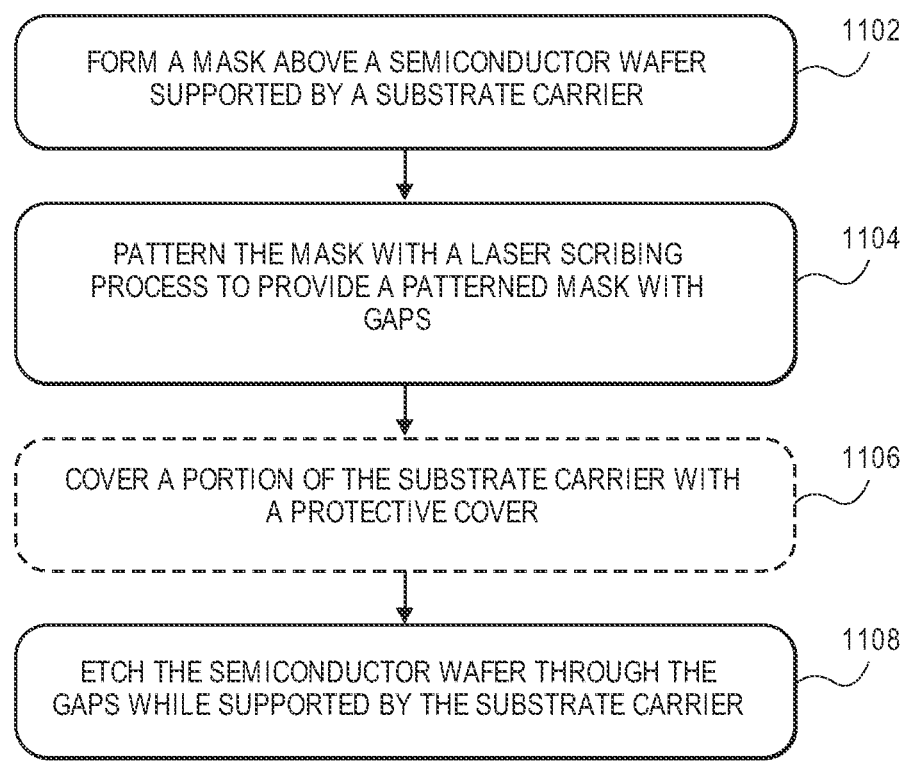
FIG. 11 is a flowchart representing operations in a method of dicing a semiconductor wafer including a plurality of integrated circuits, in accordance with an embodiment of the present invention.
Figure 12A:
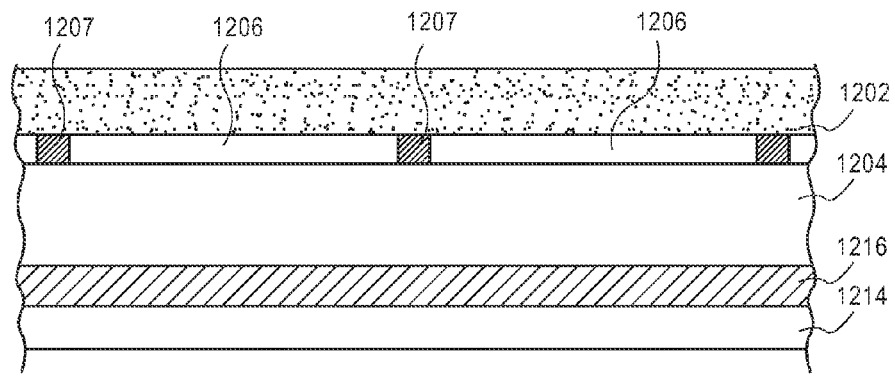
FIG. 12A illustrates a cross-sectional view of a semiconductor wafer including a plurality of integrated circuits during performing of a method of dicing the semiconductor wafer, corresponding to operation 1102 of the flowchart of FIG. 11, in accordance with an embodiment of the present invention.
Figure 12B:
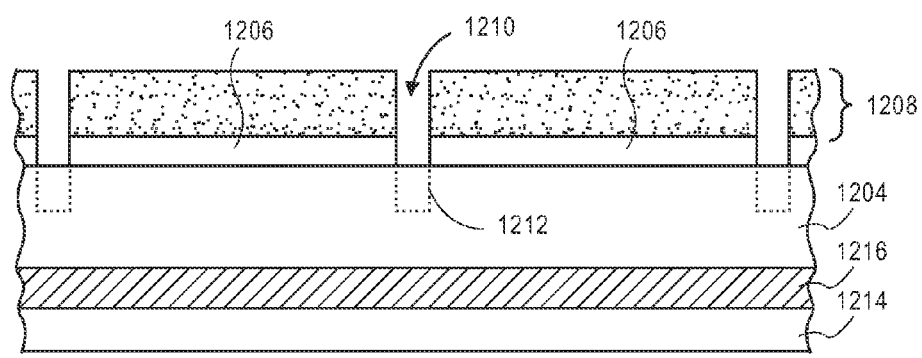
FIG. 12B illustrates a cross-sectional view of a semiconductor wafer including a plurality of integrated circuits during performing of a method of dicing the semiconductor wafer, corresponding to operation 1104 of the flowchart of FIG. 11, in accordance with an embodiment of the present invention.
Figure 12C:
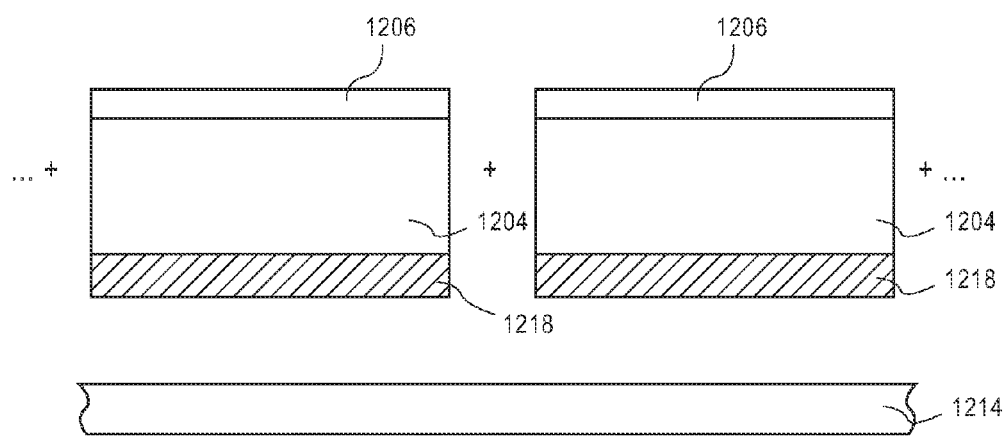
FIG. 12C illustrates a cross-sectional view of a semiconductor wafer including a plurality of integrated circuits during performing of a method of dicing the semiconductor wafer, corresponding to operation 1108 of the flowchart of FIG. 11, in accordance with an embodiment of the present invention.

In another aspect, FIG. 11 is a Flowchart 1100 representing operations in a method of dicing a semiconductor wafer including a plurality of integrated circuits, in accordance with an embodiment of the present invention. FIGS. 12A-12C illustrate cross-sectional views of a semiconductor wafer including a plurality of integrated circuits during performing of a method of dicing the semiconductor wafer, corresponding to operations of Flowchart 1100, in accordance with an embodiment of the present invention.

Referring to operation 1102 of Flowchart 1100, and corresponding FIG. 12A, a mask 1202 is formed above a semiconductor wafer or substrate 1204. The mask 1202 is composed of a layer covering and protecting integrated circuits 1206 formed on the surface of semiconductor wafer 1204. The mask 1202 also covers intervening streets 1207 formed between each of the integrated circuits 1206. The semiconductor wafer or substrate 1204 is supported by a substrate carrier 1214.

In an embodiment, the substrate carrier 1214 includes a layer of backing tape, a portion of which is depicted as 1214 in FIG. 12A, surrounded by a tape ring or frame (not shown). In one such embodiment, the semiconductor wafer or substrate 1204 is disposed on a die attach film 1216 disposed on the substrate carrier 1214, as is depicted in FIG. 12A.

In accordance with an embodiment of the present invention, forming the mask 1202 includes forming a layer such as, but not limited to, a photo-resist layer or an I-line patterning layer. For example, a polymer layer such as a photo-resist layer may be composed of a material otherwise suitable for use in a lithographic process. In one embodiment, the photo-resist layer is composed of a positive photo-resist material such as, but not limited to, a 248 nanometer (nm) resist, a 193 nm resist, a 157 nm resist, an extreme ultra-violet (EUV) resist, or a phenolic resin matrix with a diazonaphthoquinone sensitizer. In another embodiment, the photo-resist layer is composed of a negative photo-resist material such as, but not limited to, poly-cis-isoprene and poly-vinyl-cinnamate.

In another embodiment, the mask 1202 is a water-soluble mask layer. In an embodiment, the water-soluble mask layer is readily dissolvable in an aqueous media. For example, in one embodiment, the water-soluble mask layer is composed of a material that is soluble in one or more of an alkaline solution, an acidic solution, or in deionized water. In an embodiment, the water-soluble mask layer maintains its water solubility upon exposure to a heating process, such as heating approximately in the range of 50-160 degrees Celsius. For example, in one embodiment, the water-soluble mask layer is soluble in aqueous solutions following exposure to chamber conditions used in a laser and plasma etch singulation process. In one embodiment, the water-soluble mask layer is composed of a material such as, but not limited to, polyvinyl alcohol, polyacrylic acid, dextran, polymethacrylic acid, polyethylene imine, or polyethylene oxide. In a specific embodiment, the water-soluble mask layer has an etch rate in an aqueous solution approximately in the range of 1-15 microns per minute and, more particularly, approximately 1.3 microns per minute.

In another embodiment, the mask 1202 is a UV-curable mask layer. In an embodiment, the mask layer has a susceptibility to UV light that reduces an adhesiveness of the UV-curable layer by at least approximately 80%. In one such embodiment, the UV layer is composed of polyvinyl chloride or an acrylic-based material. In an embodiment, the UV-curable layer is composed of a material or stack of materials with an adhesive property that weakens upon exposure to UV light. In an embodiment, the UV-curable adhesive film is sensitive to approximately 365 nm UV light. In one such embodiment, this sensitivity enables use of LED light to perform a cure.

In an embodiment, the semiconductor wafer or substrate 1204 is composed of a material suitable to withstand a fabrication process and upon which semiconductor processing layers may suitably be disposed. For example, in one embodiment, semiconductor wafer or substrate 1204 is composed of a group IV-based material such as, but not limited to, crystalline silicon, germanium or silicon/germanium. In a specific embodiment, providing semiconductor wafer 1204 includes providing a monocrystalline silicon substrate. In a particular embodiment, the monocrystalline silicon substrate is doped with impurity atoms. In another embodiment, semiconductor wafer or substrate 1204 is composed of a III-V material such as, e.g., a III-V material substrate used in the fabrication of light emitting diodes (LEDs).

In an embodiment, the semiconductor wafer or substrate 1204 has a thickness of approximately 300 microns or less. For example, in one embodiment, a bulk single-crystalline silicon substrate is thinned from the backside prior to being affixed to the die attach film 1216. The thinning may be performed by a backside grind process. In one embodiment, the bulk single-crystalline silicon substrate is thinned to a thickness approximately in the range of 50-300 microns. According to one embodiment, the thinning is performed prior to a laser ablation and plasma etch dicing process. In an embodiment, the die attach film 1216 (or any suitable substitute capable of bonding a thinned or thin wafer or substrate to the substrate carrier 1214) has a thickness of approximately 20 microns.

In an embodiment, the semiconductor wafer or substrate 1204 has disposed thereon or therein, as a portion of the integrated circuits 1206, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 1206. Materials making up the streets 1207 may be similar to or the same as those materials used to form the integrated circuits 1206. For example, streets 1207 may be composed of layers of dielectric materials, semiconductor materials, and metallization. In one embodiment, one or more of the streets 1207 includes test devices similar to the actual devices of the integrated circuits 1206.

Referring to operation 1104 of Flowchart 1100, and corresponding FIG. 12B, the mask 1202 is patterned with a laser scribing process to provide a patterned mask 1208 with gaps 1210, exposing regions of the semiconductor wafer or substrate 1204 between the integrated circuits 1206. In one such embodiment, the laser scribing process is a femtosecond-based laser scribing process. The laser scribing process is used to remove the material of the streets 1207 originally formed between the integrated circuits 1206. In accordance with an embodiment of the present invention, patterning the mask 1202 with the laser scribing process includes forming trenches 1212 partially into the regions of the semiconductor wafer 1204 between the integrated circuits 1206, as is depicted in FIG. 12B.

In an embodiment, patterning the mask 1202 with the laser scribing process includes using a laser having a pulse width in the femtosecond range. Specifically, a laser with a wavelength in the visible spectrum plus the ultra-violet (UV) and infra-red (IR) ranges (totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask 1202, the streets 1207 and, possibly, a portion of the semiconductor wafer or substrate 1204.

Figure 13:
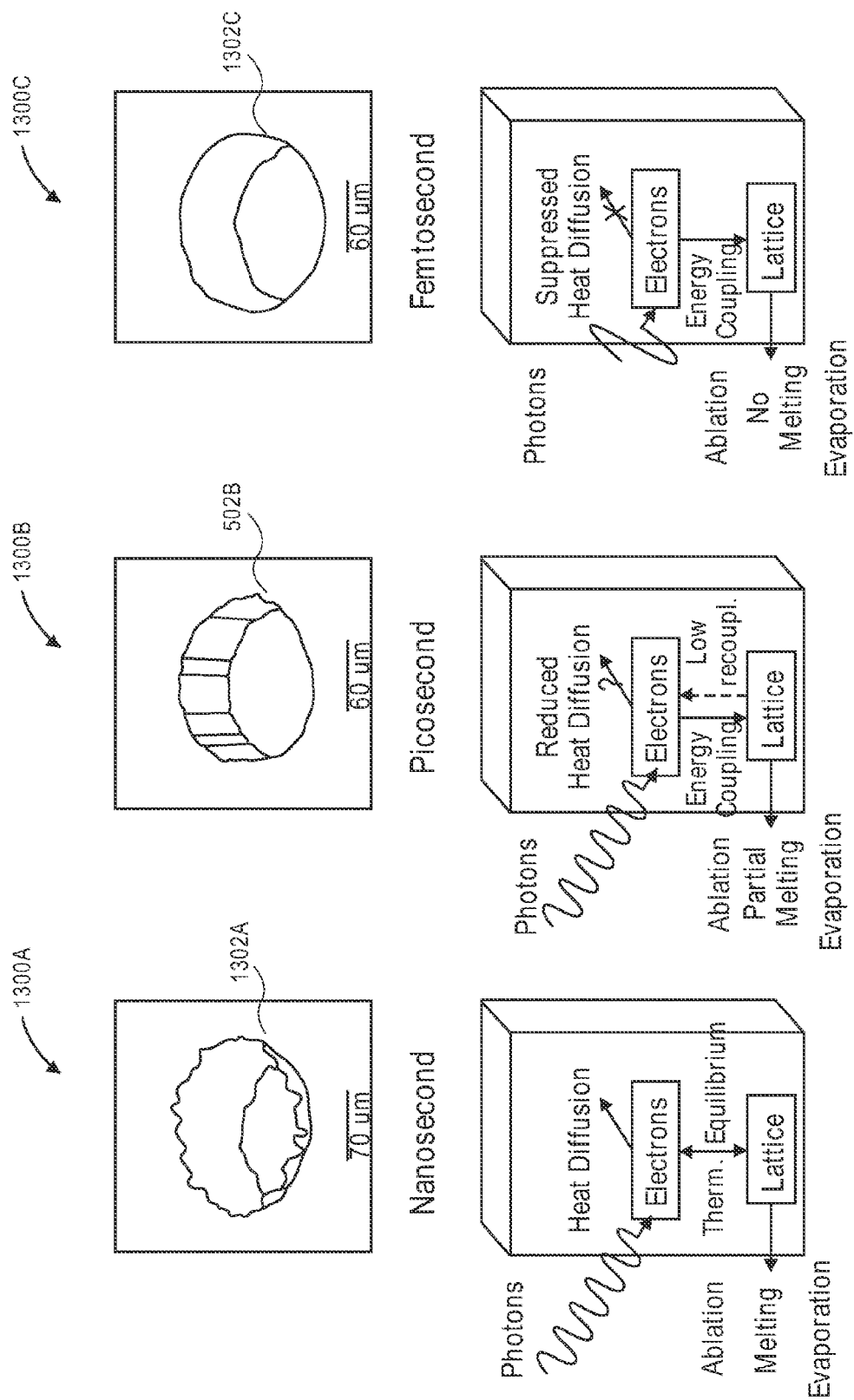
FIG. 13 illustrates the effects of using a laser pulse in the femtosecond range versus longer pulse times, in accordance with an embodiment of the present invention.

FIG. 13 illustrates the effects of using a laser pulse in the femtosecond range versus longer frequencies, in accordance with an embodiment of the present invention. Referring to FIG. 13, by using a laser with a pulse width in the femtosecond range heat damage issues are mitigated or eliminated (e.g., minimal to no damage 1302C with femtosecond processing of a via 1300C) versus longer pulse widths (e.g., damage 1302B with picosecond processing of a via 1300B and significant damage 1302A with nanosecond processing of a via 1300A). The elimination or mitigation of damage during formation of via 1300C may be due to a lack of low energy recoupling (as is seen for picosecond-based laser ablation) or thermal equilibrium (as is seen for nanosecond-based laser ablation), as depicted in FIG. 13.

Laser parameters selection, such as pulse width, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

By contrast, if non-optimal laser parameters are selected, in a stacked structure that involves, e.g., two or more of an inorganic dielectric, an organic dielectric, a semiconductor, or a metal, a laser ablation process may cause delamination issues. For example, a laser penetrate through high bandgap energy dielectrics (such as silicon dioxide with an approximately of 9 eV bandgap) without measurable absorption. However, the laser energy may be absorbed in an underlying metal or silicon layer, causing significant vaporization of the metal or silicon layers. The vaporization may generate high pressures to lift-off the overlying silicon dioxide dielectric layer and potentially causing severe interlayer delamination and microcracking. In an embodiment, while picoseconds-based laser irradiation processes lead to microcracking and delaminating in complex stacks, femtosecond-based laser irradiation processes have been demonstrated to not lead to microcracking or delamination of the same material stacks.

In order to be able to directly ablate dielectric layers, ionization of the dielectric materials may need to occur such that they behave similar to a conductive material by strongly absorbing photons. The absorption may block a majority of the laser energy from penetrating through to underlying silicon or metal layers before ultimate ablation of the dielectric layer. In an embodiment, ionization of inorganic dielectrics is feasible when the laser intensity is sufficiently high to initiate photon-ionization and impact ionization in the inorganic dielectric materials.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The spacial beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 uJ to 100 uJ, although preferably approximately in the range of 1 uJ to 5 uJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Referring to optional operation 1106 of Flowchart 1100, in accordance with an embodiment of the present invention, a portion of the substrate carrier is covered with a TPG shadow ring or a plasma thermal shield, or both, in preparation for an etch portion of the dicing process. In one embodiment, the TPG shadow ring or a plasma thermal shield, or both, is included in a plasma etching chamber. In one embodiment, the actively-cooled shadow ring or a plasma thermal shield, or a combination of both, leaves exposed a portion of, but not all of, the semiconductor wafer or substrate 1204, as described above in association with FIG. 4.

Referring to operation 1108 of Flowchart 1100, and corresponding FIG. 12C, the semiconductor wafer or substrate 1204 is etched through the gaps 1210 in the patterned mask 1208 to singulate the integrated circuits 1206. In accordance with an embodiment of the present invention, etching the semiconductor wafer 1204 includes etching to extend the trenches 1212 formed with the laser scribing process and to ultimately etch entirely through semiconductor wafer or substrate 1204, as depicted in FIG. 12C.

In an embodiment, etching the semiconductor wafer or substrate 1204 includes using a plasma etching process. In one embodiment, a through-silicon via type etch process is used. For example, in a specific embodiment, the etch rate of the material of semiconductor wafer or substrate 1204 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. The combination enables effective decoupling of the ion density from ion energy, so as to achieve relatively high density plasmas without the high, potentially damaging, DC bias levels, even at very low pressures. An exceptionally wide process window results. However, any plasma etch chamber capable of etching silicon may be used. In an exemplary embodiment, a deep silicon etch is used to etch a single crystalline silicon substrate or wafer 1204 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which generally a fluorine-based gas such as $SF_6$, $C_4F_8$, $CHF_3$, $XeF_2$, or any other reactant gas capable of etching silicon at a relatively fast etch rate. In one embodiment, however, a Bosch process is used which involves formation of a scalloped profile.

In an embodiment, singulation may further include patterning of die attach film 1216. In one embodiment, die attach film 1216 is patterned by a technique such as, but not limited to, laser ablation, dry (plasma) etching or wet etching. In an embodiment, the die attach film 1216 is patterned in sequence following the laser scribe and plasma etch portions of the singulation process to provide die attach film portions 1218, as depicted in FIG. 12C. In an embodiment, the patterned mask 1208 is removed after the laser scribe and plasma etch portions of the singulation process, as is also depicted in FIG. 12C. The patterned mask 1208 may be removed prior to, during, or following patterning of the die attach film 1216. In an embodiment, the semiconductor wafer or substrate 1204 is etched while supported by the substrate carrier 1214. In an embodiment, the die attach film 1216 is also patterned while disposed on the substrate carrier 1214.

Accordingly, referring again to Flowchart 1100 and FIGS. 12A-12C, wafer dicing may be preformed by initial laser ablation through a mask, through wafer streets (including metallization), and partially into a silicon substrate. The laser pulse width may be selected in the femtosecond range. Die singulation may then be completed by subsequent through-silicon deep plasma etching. In one embodiment, TPG shadow ring or a plasma thermal shield, or both, are implemented during the etch portion of the dicing process. Additionally, removal of exposed portions of the die attach film is performed to provide singulated integrated circuits, each having a portion of a die attach film thereon. The individual integrated circuits, including die attach film portions may then be removed from the substrate carrier 1214, as depicted in FIG. 12C. In an embodiment, the singulated integrated circuits are removed from the substrate carrier 1214 for packaging. In one such embodiment, the patterned die attach film 1218 is retained on the backside of each integrated circuit and included in the final packaging. However, in another embodiment, the patterned die attach film is removed during or subsequent to the singulation process.

Referring again to FIGS. 12A-12C, the plurality of integrated circuits 1206 may be separated by streets 1207 having a width of approximately 10 microns or smaller. The use of a laser scribing approach (such as a femtosecond-based laser scribing approach) may enable such compaction in a layout of integrated circuits, at least in part due to the tight profile control of the laser. For example, FIG. 14 illustrates compaction on a semiconductor wafer or substrate achieved by using narrower streets versus conventional dicing which may be limited to a minimum width, in accordance with an embodiment of the present invention.

Figure 14:
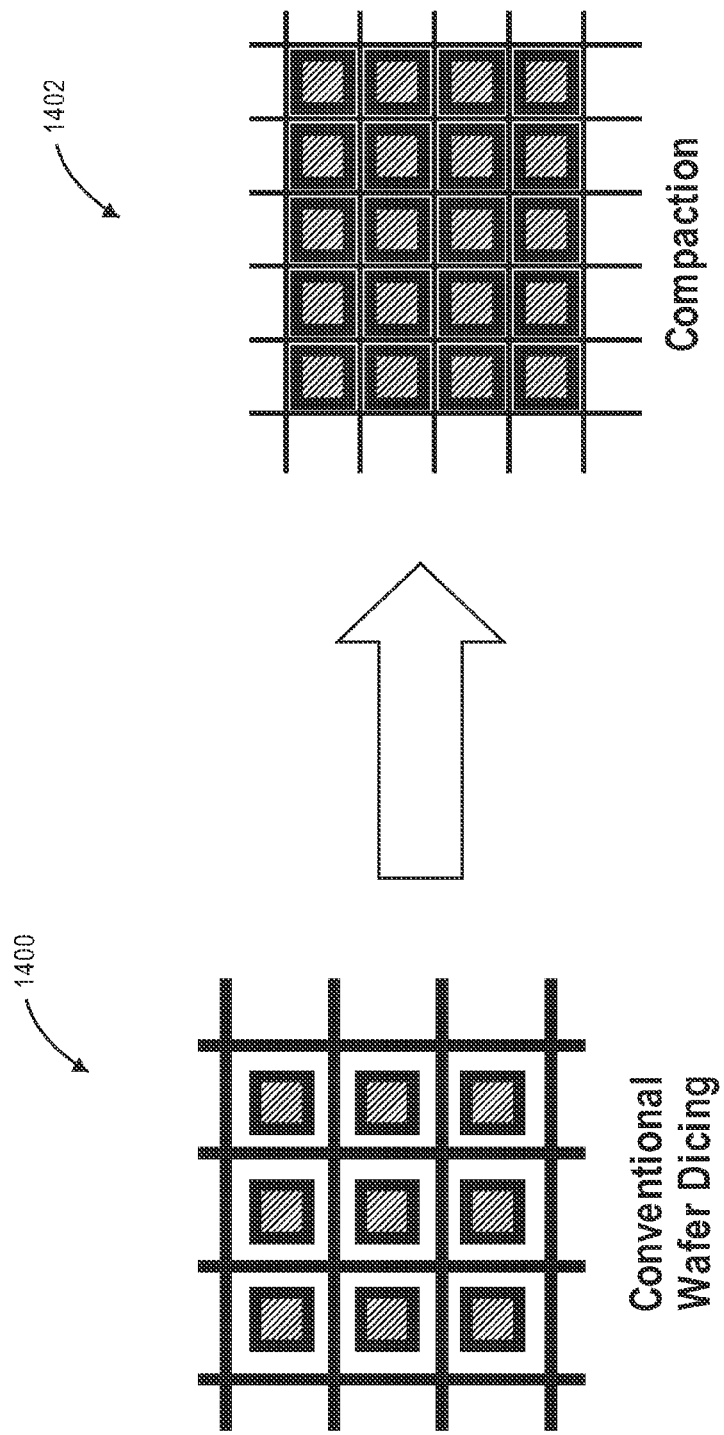
FIG. 14 illustrates compaction on a semiconductor wafer achieved by using narrower streets versus conventional dicing which may be limited to a minimum width, in accordance with an embodiment of the present invention.

Referring to FIG. 14, compaction on a semiconductor wafer is achieved by using narrower streets (e.g., widths of approximately 10 microns or smaller in layout 1402) versus conventional dicing which may be limited to a minimum width (e.g., widths of approximately 70 microns or larger in layout 1400). It is to be understood, however, that it may not always be desirable to reduce the street width to less than 10 microns even if otherwise enabled by a femtosecond-based laser scribing process. For example, some applications may require a street width of at least 40 microns in order to fabricate dummy or test devices in the streets separating the integrated circuits.

Figure 15:
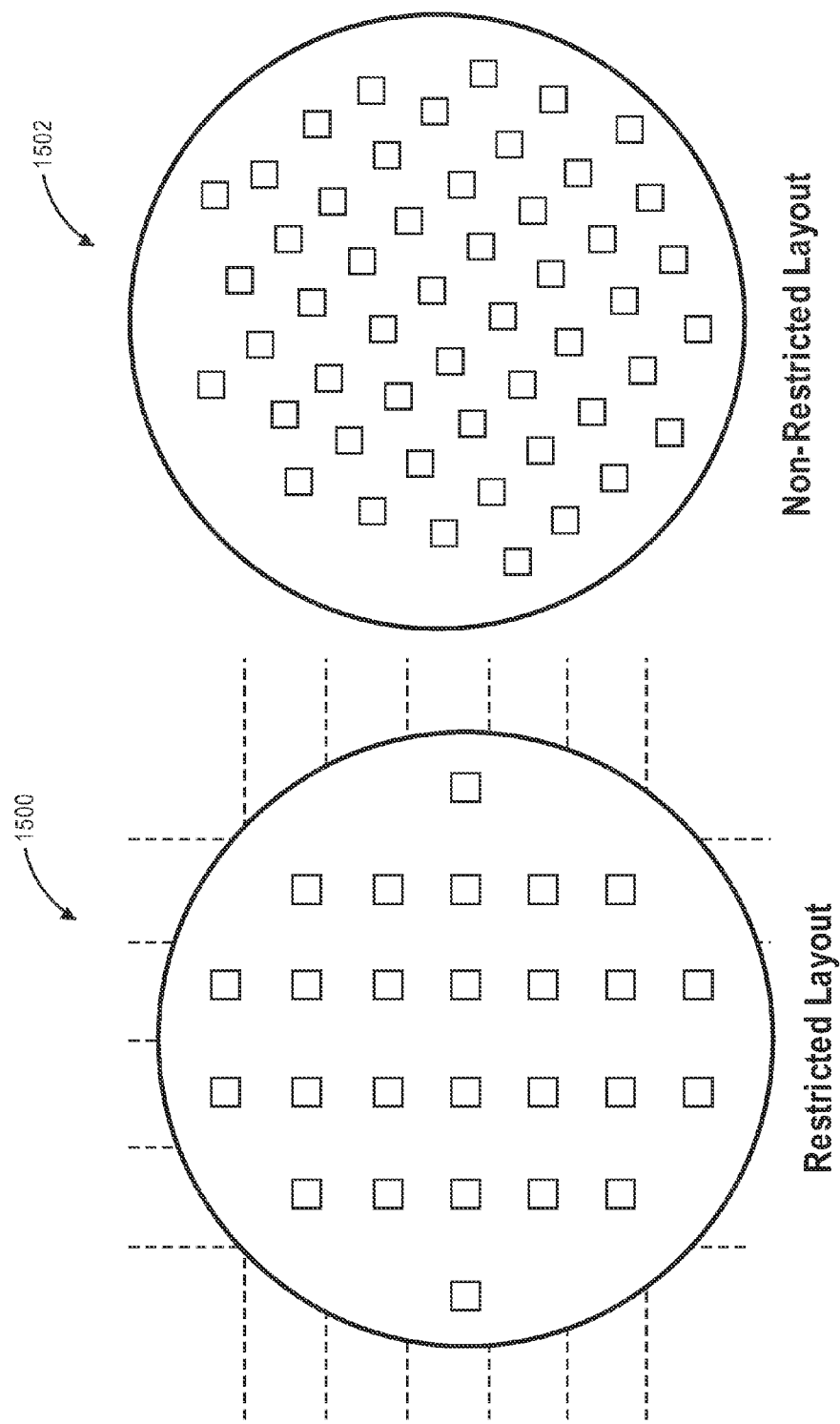
FIG. 15 illustrates freeform integrated circuit arrangement allowing denser packing and, hence, more die per wafer versus grid alignment approaches, in accordance with an embodiment of the present invention.

Referring again to FIGS. 12A-12C, the plurality of integrated circuits 1206 may be arranged on semiconductor wafer or substrate 1204 in a non-restricted layout. For example, FIG. 15 illustrates a freeform integrated circuit arrangement allowing denser packing. The denser packing may provide for more die per wafer versus grid alignment approaches, in accordance with an embodiment of the present invention. Referring to FIG. 15, a freeform layout (e.g., a non-restricted layout on semiconductor wafer or substrate 1502) allows denser packing and hence more die per wafer versus grid alignment approaches (e.g., a restricted layout on semiconductor wafer or substrate 1500). In an embodiment, the speed of the laser ablation and plasma etch singulation process is independent of die size, layout or the number of streets.

A single process tool may be configured to perform many or all of the operations in a hybrid laser ablation and plasma etch singulation process. For example, FIG. 16 illustrates a block diagram of a tool layout for laser and plasma dicing of wafers or substrates, in accordance with an embodiment of the present invention.

Figure 16:
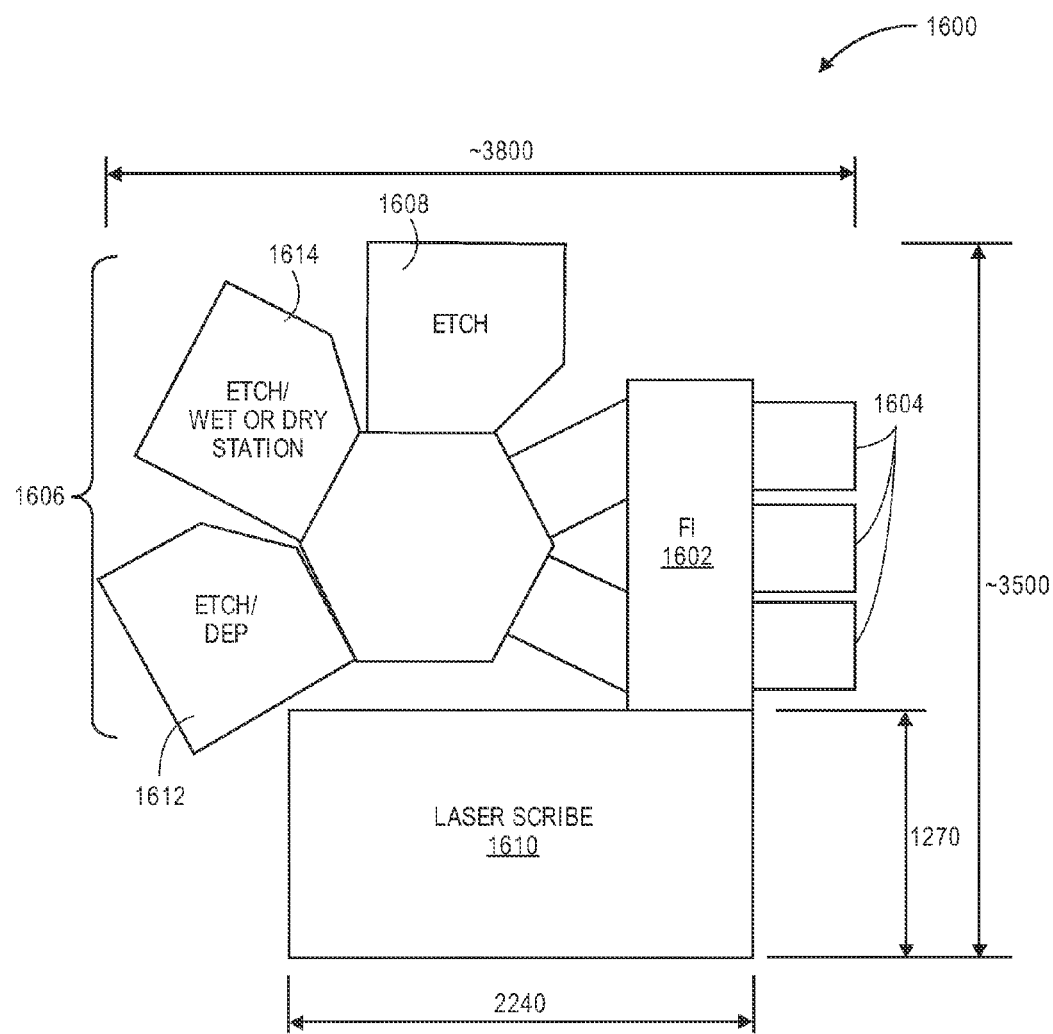
FIG. 16 illustrates a block diagram of a tool layout for laser and plasma dicing of wafers or substrates, in accordance with an embodiment of the present invention.

Referring to FIG. 16, a process tool 1600 includes a factory interface 1602 (FI) having a plurality of load locks 1604 coupled therewith. A cluster tool 1606 is coupled with the factory interface 1602. The cluster tool 1606 includes one or more plasma etch chambers, such as plasma etch chamber 1608. A laser scribe apparatus 1610 is also coupled to the factory interface 1602. The overall footprint of the process tool 1600 may be, in one embodiment, approximately 3500 millimeters (3.5 meters) by approximately 3800 millimeters (3.8 meters), as depicted in FIG. 16.

In an embodiment, the laser scribe apparatus 1610 houses a femtosecond-based laser. The femtosecond-based laser may be suitable for performing a laser ablation portion of a hybrid laser and etch singulation process, such as the laser abalation processes described above. In one embodiment, a moveable stage is also included in laser scribe apparatus 1610, the moveable stage configured for moving a wafer or substrate (or a carrier thereof) relative to the femtosecond-based laser. In a specific embodiment, the femtosecond-based laser is also moveable. The overall footprint of the laser scribe apparatus 1610 may be, in one embodiment, approximately 2240 millimeters by approximately 1270 millimeters, as depicted in FIG. 16.

In an embodiment, the one or more plasma etch chambers 1608 is configured for etching a wafer or substrate through the gaps in a patterned mask to singulate a plurality of integrated circuits. In one such embodiment, the one or more plasma etch chambers 1608 is configured to perform a deep silicon etch process. In a specific embodiment, the one or more plasma etch chambers 1608 is an Applied Centura® Silvia™ Etch system, available from Applied Materials of Sunnyvale, Calif., USA. The etch chamber may be specifically designed for a deep silicon etch used to create singulate integrated circuits housed on or in single crystalline silicon substrates or wafers. In an embodiment, a high-density plasma source is included in the plasma etch chamber 1608 to facilitate high silicon etch rates. In an embodiment, more than one etch chamber is included in the cluster tool 1606 portion of process tool 1600 to enable high manufacturing throughput of the singulation or dicing process. In accordance with an embodiment of the present invention, one or more of the etch chambers is equipped with a TPG shadow ring or a plasma thermal shield, or both.

The factory interface 1602 may be a suitable atmospheric port to interface between an outside manufacturing facility with laser scribe apparatus 1610 and cluster tool 1606. The factory interface 1602 may include robots with arms or blades for transferring wafers (or carriers thereof) from storage units (such as front opening unified pods) into either cluster tool 1606 or laser scribe apparatus 1610, or both.

Cluster tool 1606 may include other chambers suitable for performing functions in a method of singulation. For example, in one embodiment, in place of an additional etch chamber, a deposition chamber 1612 is included. The deposition chamber 1612 may be configured for mask deposition on or above a device layer of a wafer or substrate prior to laser scribing of the wafer or substrate. In one such embodiment, the deposition chamber 1612 is suitable for depositing a water soluble mask layer. In another embodiment, in place of an additional etch chamber, a wet/dry station 1614 is included. The wet/dry station may be suitable for cleaning residues and fragments, or for removing a water soluble mask, subsequent to a laser scribe and plasma etch singulation process of a substrate or wafer. In an embodiment, a metrology station is also included as a component of process tool 1600.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 1600 described in association with FIG. 16 or with etch chamber 1000 described in association with FIG. 10. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 17:
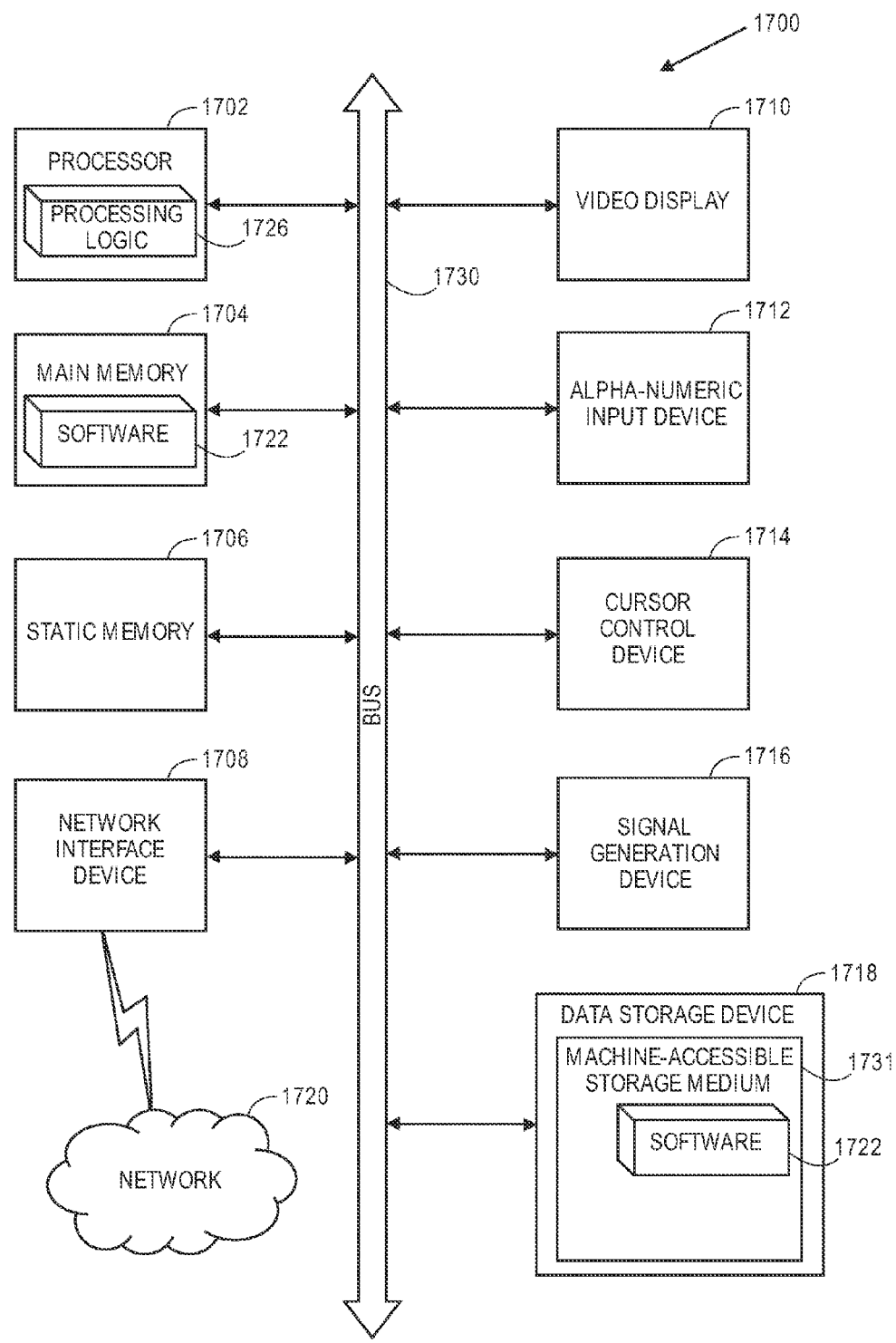
FIG. 17 illustrates a block diagram of an exemplary computer system, in accordance with an embodiment of the present invention.

FIG. 17 illustrates a diagrammatic representation of a machine in the exemplary form of a computer system 1700 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1700 includes a processor 1702, a main memory 1704 (e.g., read-only memory (ROM), flash memory, dynamic random access memory (DRAM) such as synchronous DRAM (SDRAM) or Rambus DRAM (RDRAM), etc.), a static memory 1706 (e.g., flash memory, static random access memory (SRAM), etc.), and a secondary memory 1718 (e.g., a data storage device), which communicate with each other via a bus 1730.

Processor 1702 represents one or more general-purpose processing devices such as a microprocessor, central processing unit, or the like. More particularly, the processor 1702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1702 may also be one or more special-purpose processing devices such as an application specific integrated circuit (ASIC), a field programmable gate array (FPGA), a digital signal processor (DSP), network processor, or the like. Processor 1702 is configured to execute the processing logic 1726 for performing the operations described herein.

The computer system 1700 may further include a network interface device 1708. The computer system 1700 also may include a video display unit 1710 (e.g., a liquid crystal display (LCD), a light emitting diode display (LED), or a cathode ray tube (CRT)), an alphanumeric input device 1712 (e.g., a keyboard), a cursor control device 1714 (e.g., a mouse), and a signal generation device 1716 (e.g., a speaker).

The secondary memory 1718 may include a machine-accessible storage medium (or more specifically a computer-readable storage medium) 1731 on which is stored one or more sets of instructions (e.g., software 1722) embodying any one or more of the methodologies or functions described herein. The software 1722 may also reside, completely or at least partially, within the main memory 1704 and/or within the processor 1702 during execution thereof by the computer system 1700, the main memory 1704 and the processor 1702 also constituting machine-readable storage media. The software 1722 may further be transmitted or received over a network 1720 via the network interface device 1708.

While the machine-accessible storage medium 1731 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of dicing a semiconductor wafer having a plurality of integrated circuits. The method involves introducing a substrate supported by a substrate carrier into a plasma etch chamber. The substrate has a patterned mask thereon covering integrated circuits and exposing streets of the substrate. The method also involves clamping the substrate carrier below a shadow ring. The shadow ring includes an annular body, and a plurality of posts attached to the annular body and positioned substantially below the bottom surface of the annular body. Each of the plurality of posts comprises an inner core of TPG. The method further involves plasma etching the substrate through the streets to singulate the integrated circuits. The shadow ring shields the substrate carrier from the plasma etching, and is cooled via heat conduction through the inner core of TPG during the plasma etching.

Thus, methods of and apparatuses for dicing semiconductor wafers, each wafer having a plurality of integrated circuits, have been disclosed.

What is claimed is:

1. A shadow ring assembly for a plasma chamber, the shadow ring assembly comprising:

an annular body comprising a thermally conductive material, wherein the annular body comprises a top surface to face an interior of the plasma chamber, and a bottom surface to face a substrate carrier in the plasma chamber;

a plurality of posts attached to the annular body and positioned substantially below the bottom surface of the annular body, wherein each of the plurality of posts comprises an inner core of thermal pyrolytic graphite (TPG); and a plasma resistant coating on the annular body and the plurality of posts.

2. The shadow ring assembly of claim 1, wherein the annular body further comprises an inner annular core of TPG.

3. The shadow ring assembly of claim 1, wherein the inner annular core of the annular body comprises a plurality of wedge-shaped TPG sections.

4. The shadow ring assembly of claim 1, wherein each of the plurality of posts further comprises a thermally conductive material between the inner core and the plasma resistant coating, wherein the thermally conductive material completely encapsulates the inner core.

5. The shadow ring assembly of claim 1, further comprising a plurality of thermally conductive plates, wherein each of the thermally conductive plates is to physically couple with one of the plurality of posts at an end opposite to the annular body.

6. The shadow ring assembly of claim 1, wherein the plurality of posts comprises three cylindrical posts oriented substantially perpendicularly to the annular body.

7. The shadow ring assembly of claim 1, wherein the thermal conductivity of the inner core is 1400-1700 watts per meter K (W/(m·K)).

8. The shadow ring assembly of claim 1, wherein the inner core of TPG comprises a plurality of layers, wherein each of the plurality of layers is substantially perpendicular to the annular body.

9. The shadow ring assembly of claim 1, wherein a diameter of the inner core of each of the posts is in a range of 0.25-1 inch.

10. The shadow ring assembly of claim 1, wherein each of the plurality of posts is completely under the annular body.

11. The shadow ring assembly of claim 1, wherein each of the plurality of posts is attached to a side of the annular body.

12. The shadow ring assembly of claim 1, wherein an inner opening of the annular body is sized to expose, from a top-down perspective, a portion of, but not all of, a substrate processing region of the plasma chamber to a plasma source of the plasma chamber.

13. The shadow ring assembly of claim 12, wherein the annular body is sized for clamping a tape frame of the substrate carrier and for covering the tape frame and open tape region of the substrate carrier, and wherein in the inner opening is sized to expose all but the outermost approximately 1-1.5 millimeters of a substrate supported by the substrate carrier to the plasma source of the plasma chamber.

14. The shadow ring assembly of claim 1, wherein the annular body comprises aluminum having a hard anodized surface or a ceramic coating.

15. A shadow ring assembly for a plasma processing chamber, the shadow ring assembly comprising:

a shadow ring having an annular body and an inner opening, wherein the inner opening is sized to expose, from a top-down perspective, at least a portion of a substrate to a plasma source of the plasma processing chamber; and a plurality of solid state cooling posts attached to the annular body and positioned substantially below the annular body, wherein each of the plurality of solid state cooling posts comprises a thermally conductive inner core and a thermally conductive outer layer, wherein the thermally conductive inner core has a thermal conductivity at least three times greater than the thermally conductive outer layer.

16. The shadow ring assembly of claim 15, wherein the thermally conductive core comprises thermal pyrolytic graphite (TPG), and the thermally conductive outer layer comprises aluminum.

17. The shadow ring assembly of claim 15, wherein the annular body further comprises an inner annular core of TPG.

18. The shadow ring assembly of claim 15, wherein the thermally conductive outer layer completely encapsulates the inner core.

19. The shadow ring assembly of claim 15, further comprising a plurality of thermally conductive plates, wherein each of the thermally conductive plates is to physically couple with one of the plurality of solid state cooling posts at an end opposite to the annular body.

* * * * *